(12) United States Patent
Sano et al.

(10) Patent No.: US 10,083,877 B1
(45) Date of Patent: Sep. 25, 2018

(54) VERTICAL FIELD EFFECT TRANSISTORS INCLUDING TWO-TIER SELECT GATES AND METHOD OF MAKING THE SAME

(71) Applicant: SANDISK TECHNOLOGIES LLC, Plano, TX (US)

(72) Inventors: Michiaki Sano, Yokkaichi (JP); Tetsuya Yamada, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/793,178

(22) Filed: Oct. 25, 2017

(51) Int. Cl.
*H01L 21/8234* (2006.01)
*H01L 21/8239* (2006.01)
*H01L 27/105* (2006.01)
*H01L 27/11* (2006.01)
*H01L 29/788* (2006.01)
(Continued)

(52) U.S. Cl.
CPC ........ *H01L 21/823487* (2013.01); *H01L 21/28132* (2013.01); *H01L 21/8239* (2013.01); *H01L 21/823425* (2013.01); *H01L 27/0886* (2013.01); *H01L 27/1052* (2013.01); *H01L 27/1112* (2013.01); *H01L 29/788* (2013.01)

(58) Field of Classification Search
CPC ....... H01L 21/823487; H01L 21/28132; H01L 21/823425; H01L 21/8239
See application file for complete search history.

(56) References Cited

U.S. PATENT DOCUMENTS 5,915,167 A 6/1999 Leedy
6,580,124 B1 6/2003 Cleeves et al.
6,881,994 B2 4/2005 Lee et al.
(Continued)

FOREIGN PATENT DOCUMENTS

WO WO2007004843 A1 1/2007

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Dung Le
(74) *Attorney, Agent, or Firm* — The Marbury Law Group PLLC

(57) ABSTRACT

A two-dimensional array of vertical field effect transistors is provided, which includes a first-tier structure and a second-tier structure. The first-tier structure includes a laterally alternating sequence of semiconductor rail structures and first dielectric isolation rails that alternates along a first horizontal direction. A first gate dielectric and a first gate electrode that laterally extend along a second horizontal direction are disposed between each neighboring pair of a semiconductor rail structure and a first dielectric isolation rail. The second-tier structure includes a laterally alternating sequence of composite rail structures and second dielectric isolation rails that alternates along the second horizontal direction. Each of the composite rail structures includes a laterally alternating plurality of semiconductor pillar structures and dielectric pillar structures. A second gate dielectric and a second gate electrode are disposed between each neighboring pair of a composite rail structure and a second dielectric isolation rail.

22 Claims, 17 Drawing Sheets

(51) Int. Cl.
*H01L 21/28* (2006.01)
*H01L 27/088* (2006.01)

(56) References Cited

U.S. PATENT DOCUMENTS

| | | | |
|---|---|---|---|
| 7,701,746 | B2 | 4/2010 | Meeks et al. |
| 7,764,534 | B2 | 7/2010 | Thorp et al. |
| 9,331,088 | B2 | 5/2016 | Takaki |
| 9,343,507 | B2 | 5/2016 | Takaki |
| 9,437,658 | B2 | 9/2016 | Sakotsubo |
| 9,583,615 | B2 | 2/2017 | Chen et al. |
| 9,773,888 | B2 * | 9/2017 | Pulugurtha ......... H01L 29/7827 |
| 2002/0028541 | A1 | 3/2002 | Lee et al. |
| 2010/0237407 | A1 * | 9/2010 | Nojima .............. G11C 13/0004 257/329 |
| 2013/0043455 | A1 | 2/2013 | Bateman |
| 2017/0141161 | A1 | 5/2017 | Sakotsubo |
| 2017/0154925 | A1 * | 6/2017 | Shimabukuro ....... H01L 27/249 |

OTHER PUBLICATIONS

Kurotsuchi, K. et al., "2.8-GB/s-write and 670-MB/s-erase operations of a 3D vertical chain-cell-type phase-change-memory array," 2015 Symposium on VLSI Technology Digest of Technical Papers, pp. T92-T93, (2015).
U.S. Appl. No. 15/400,244, filed Jan. 6, 2017, SanDisk Technologies LLC.
U.S. Appl. No. 15/632,773, filed Jun. 26, 2017, SanDisk Technologies LLC.
U.S. Appl. No. 15/633,092, filed Jun. 26, 2017, SanDisk Technologies LLC.
U.S. Appl. No. 15/672,929, filed Aug. 9, 2017, SanDisk Technologies LLC.
U.S. Appl. No. 15/711,075, filed Sep. 21, 2017, SanDisk Technologies LLC.
U.S. Appl. No. 15/715,532, filed Sep. 26, 2017, SanDisk Technologies LLC.
U.S. Appl. No. 15/720,490, filed Sep. 29, 2017, SanDisk Technologies LLC.

* cited by examiner

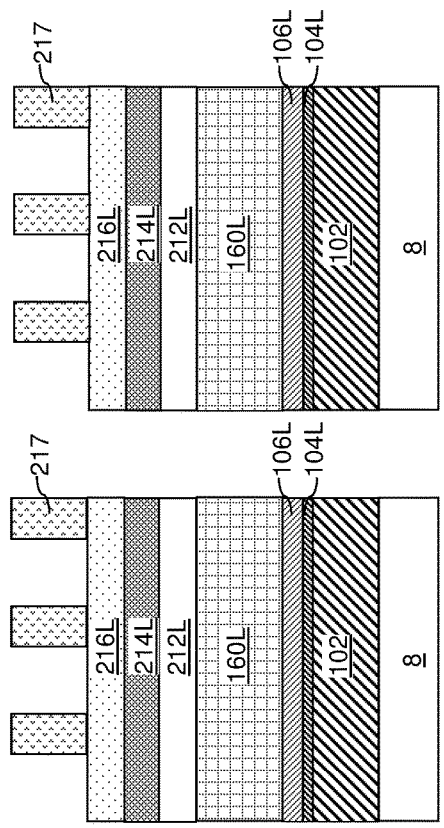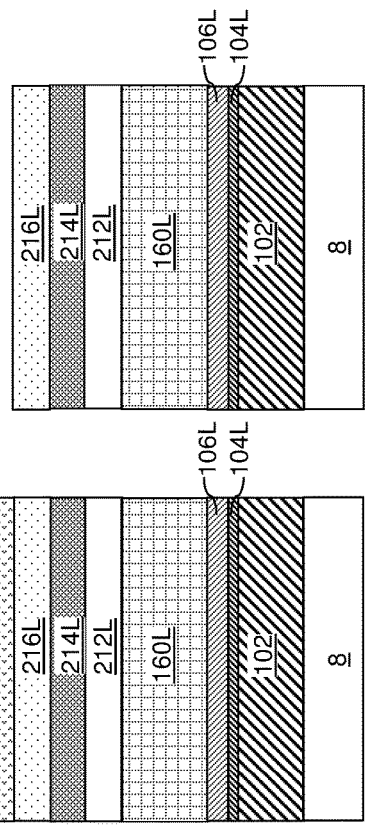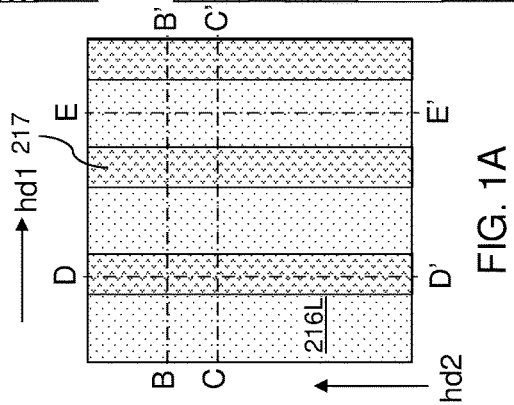
FIG. 1B  FIG. 1C  FIG. 1D  FIG. 1E  FIG. 1A

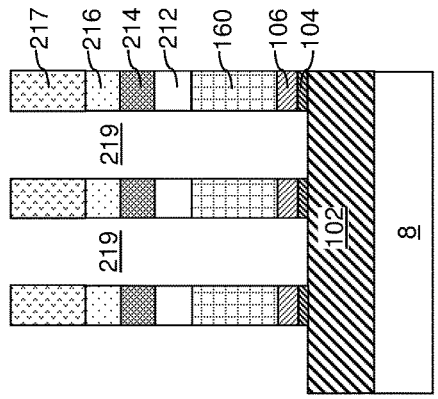
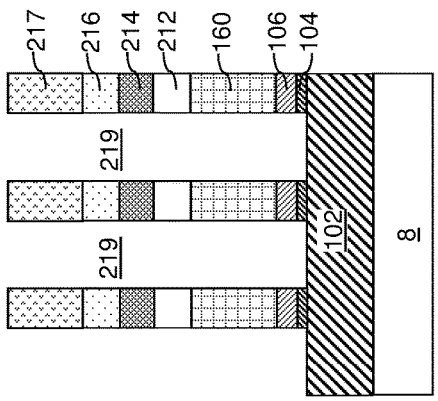
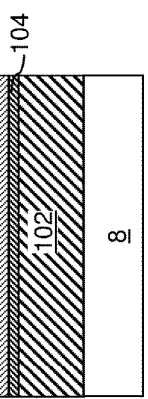
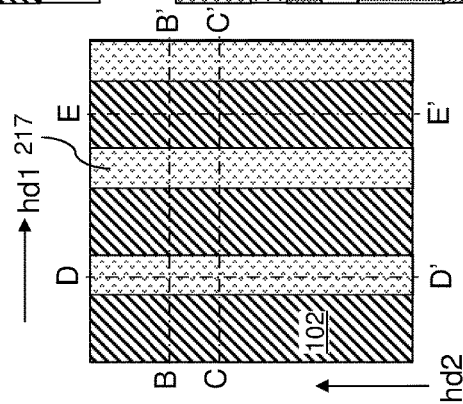

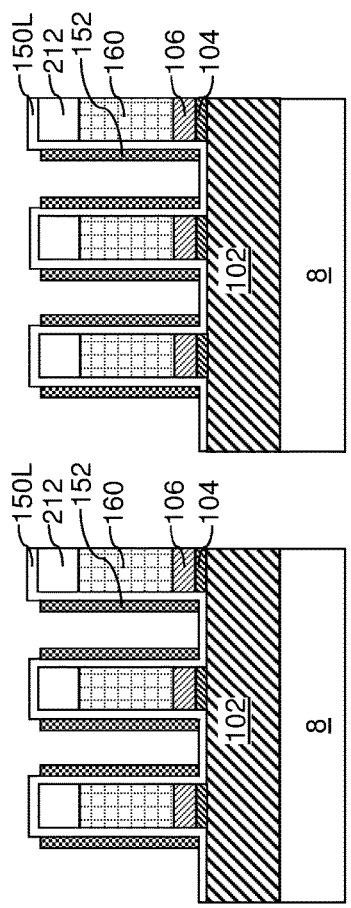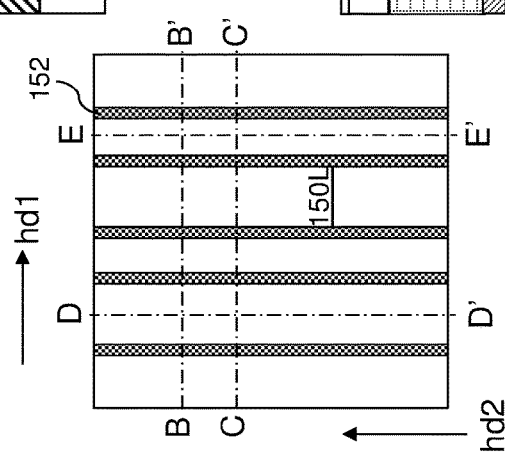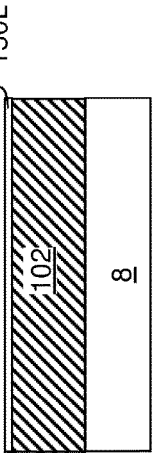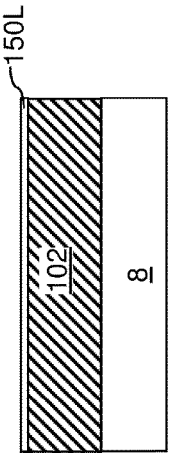

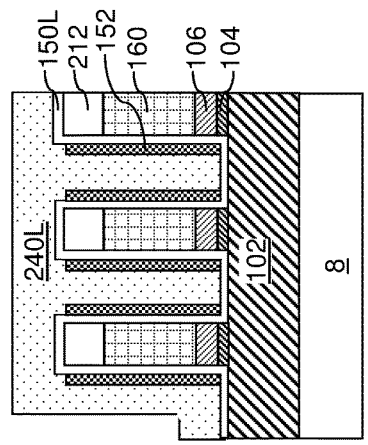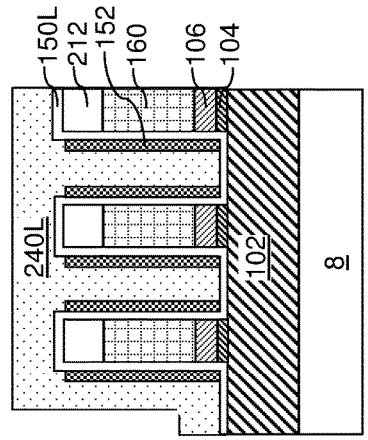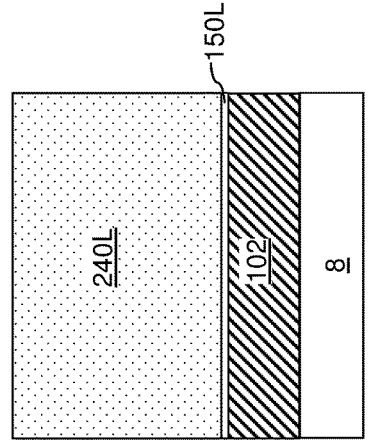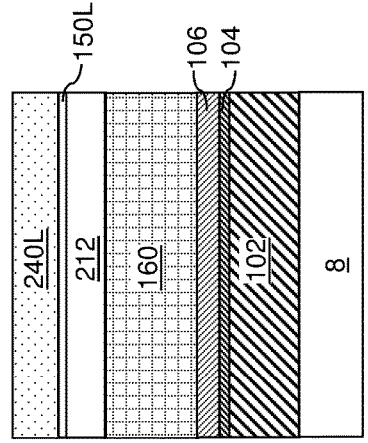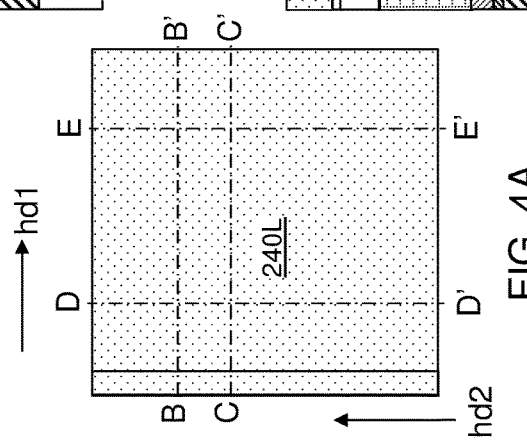

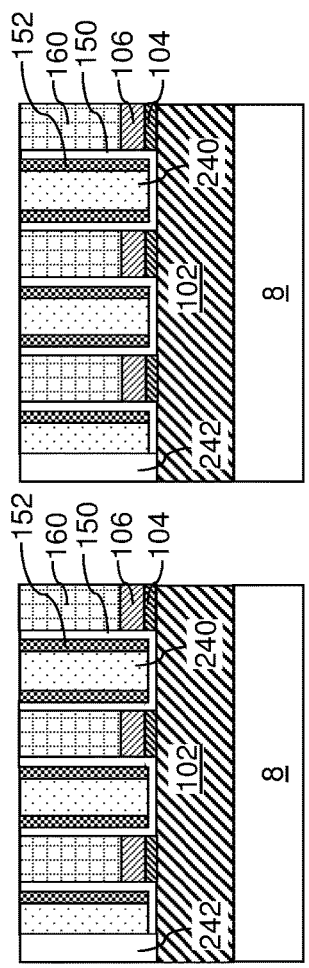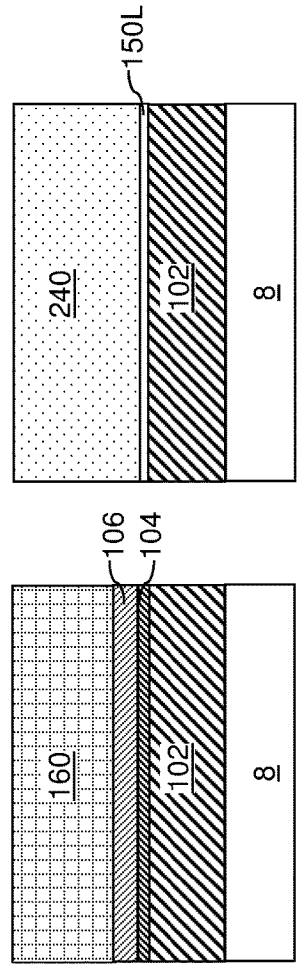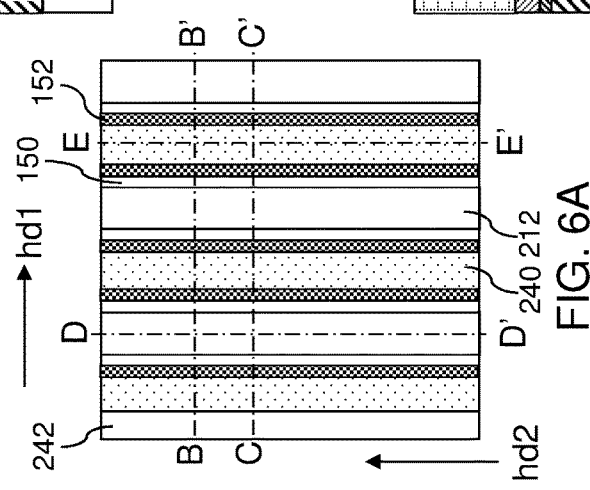

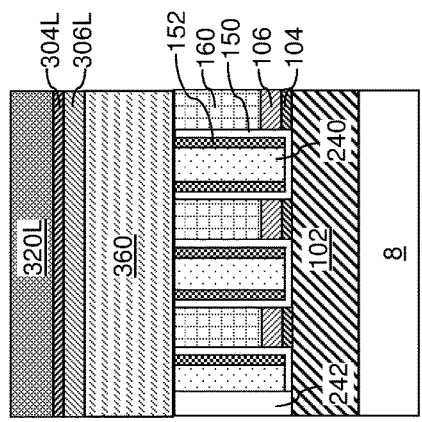
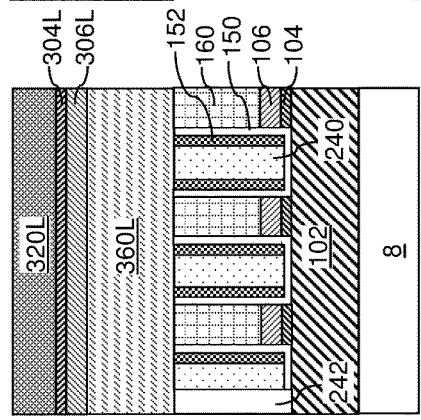
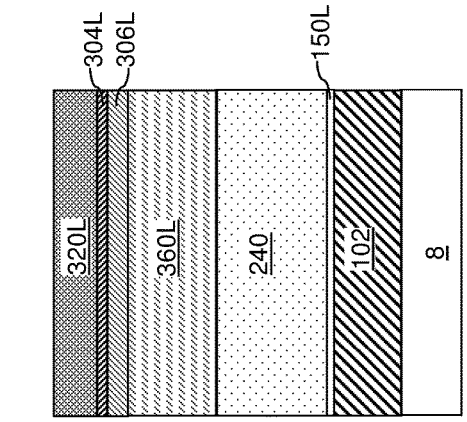
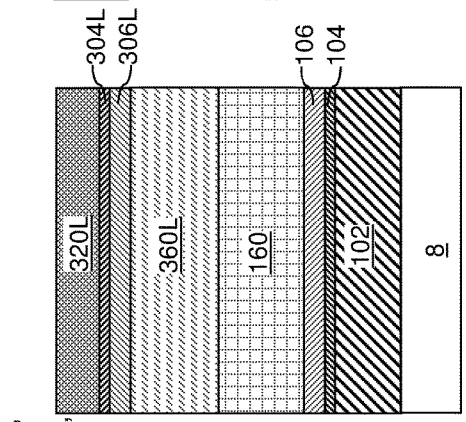
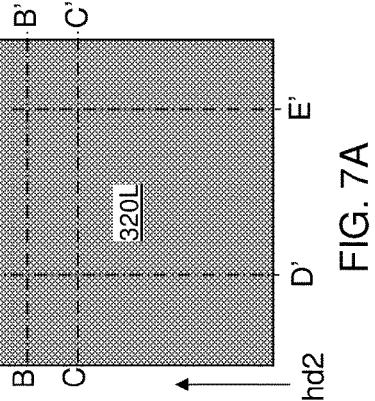

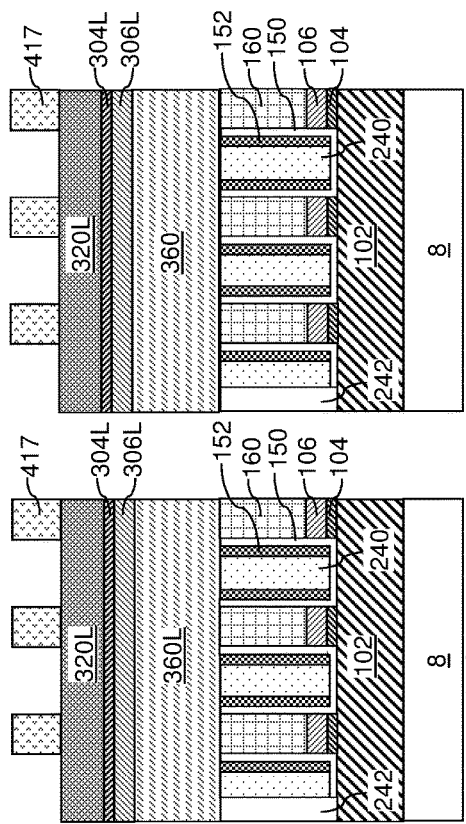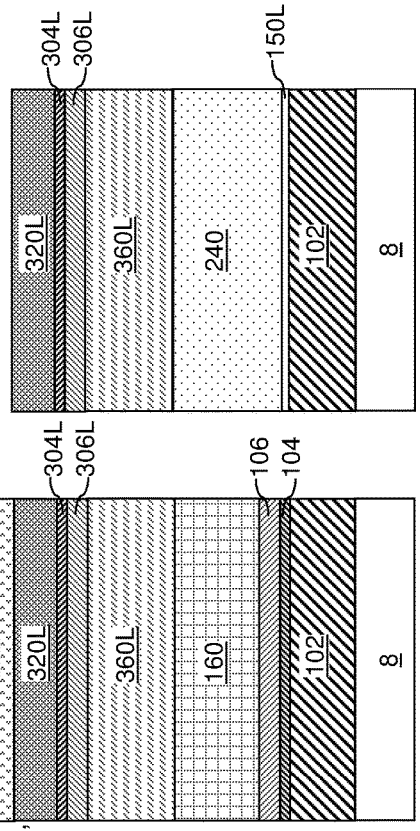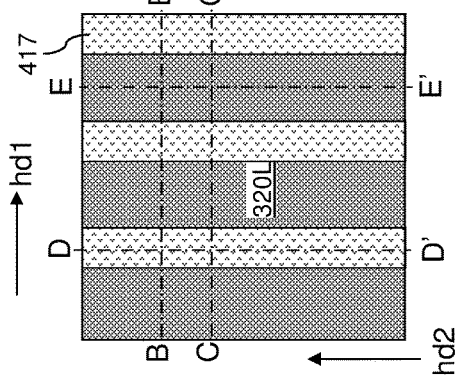

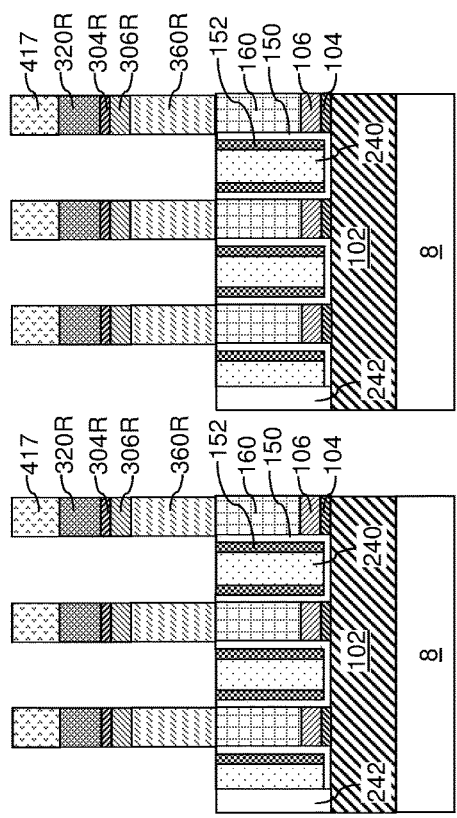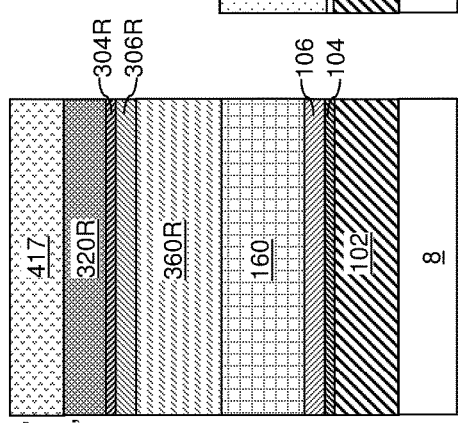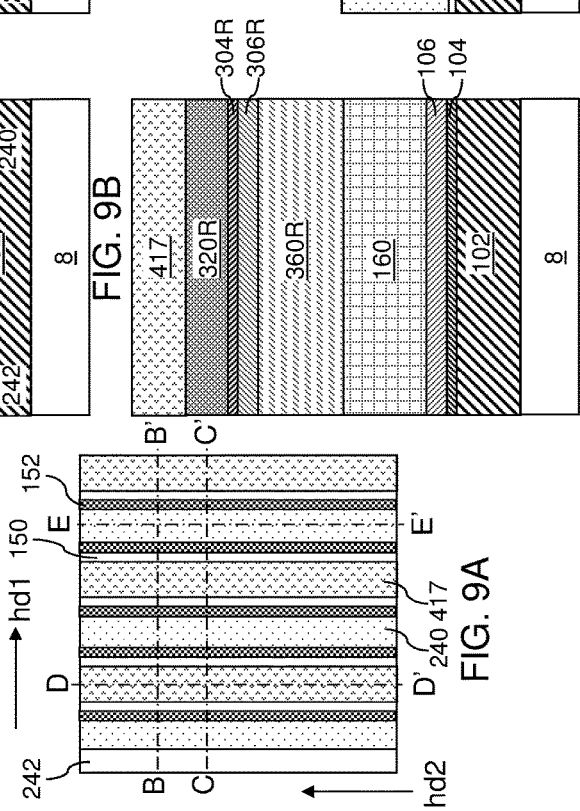

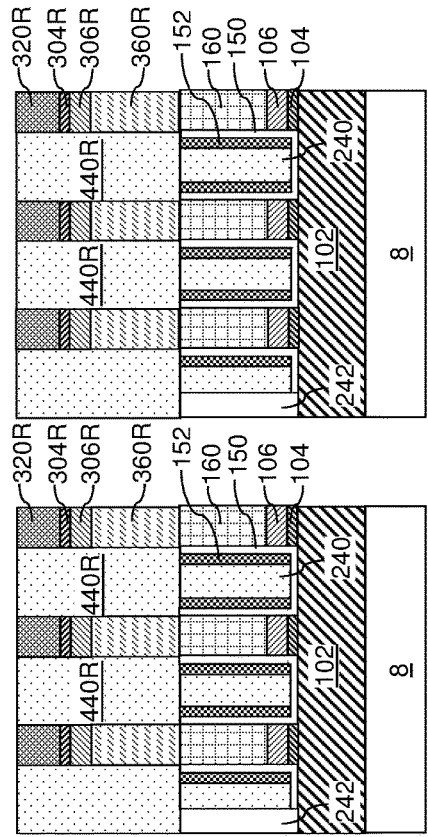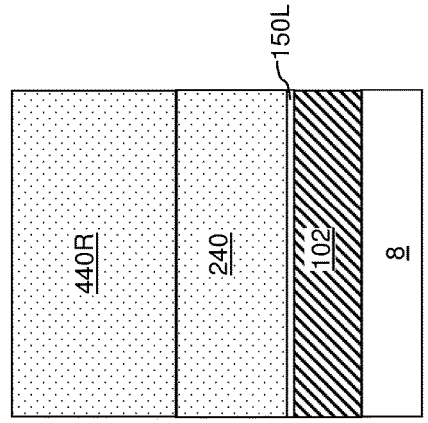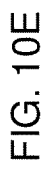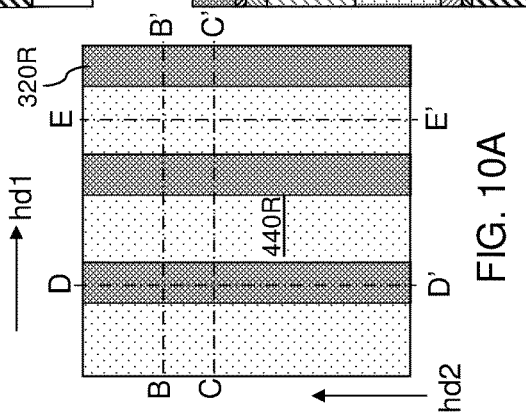

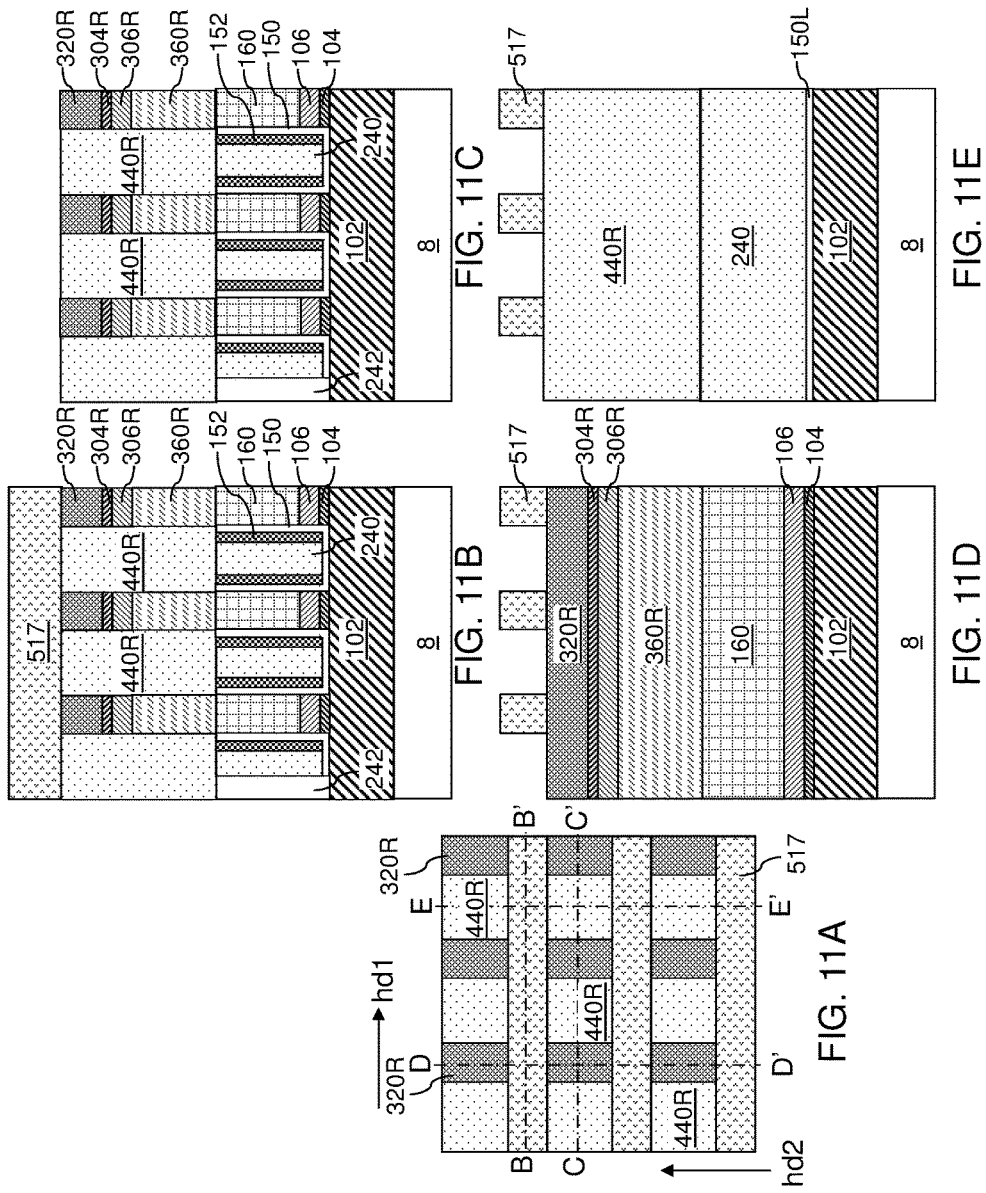

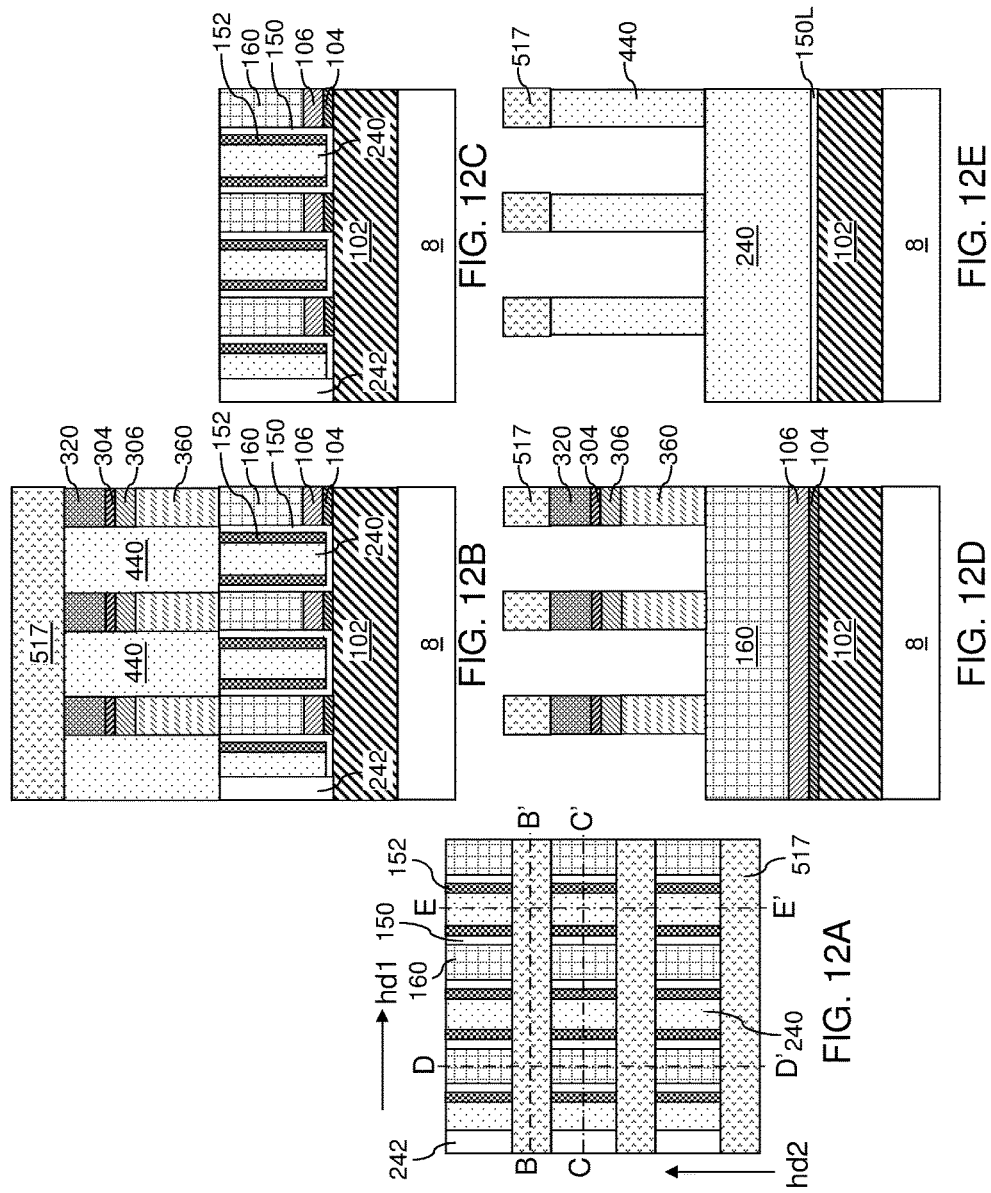

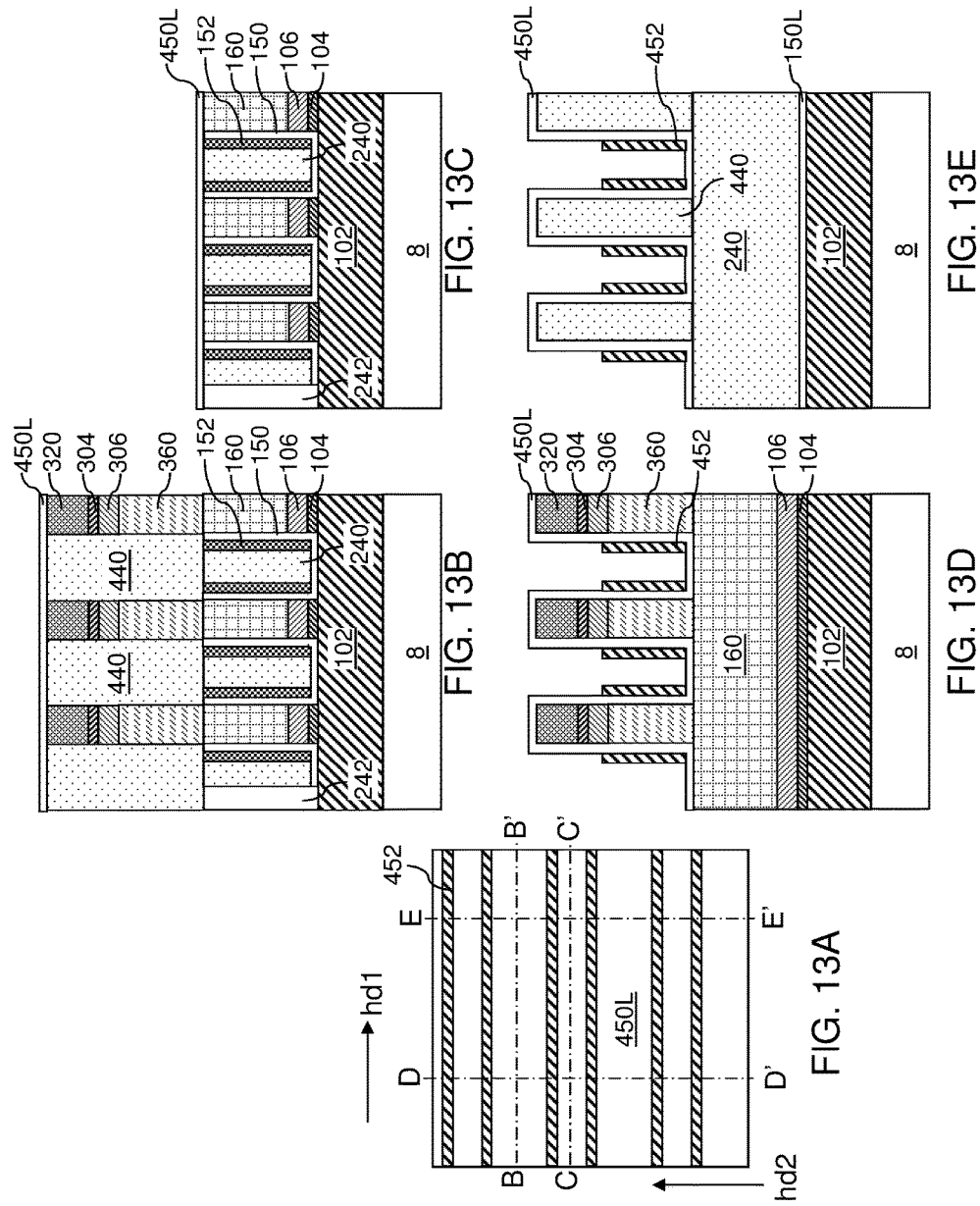

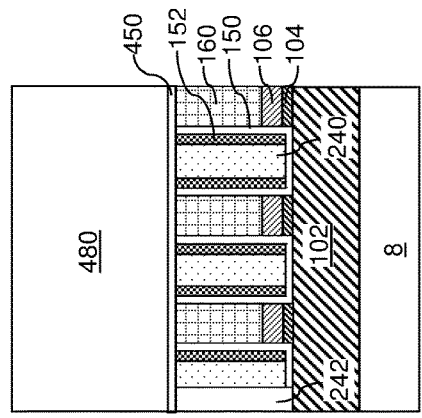
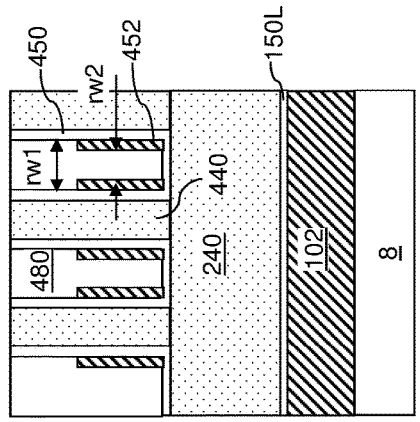
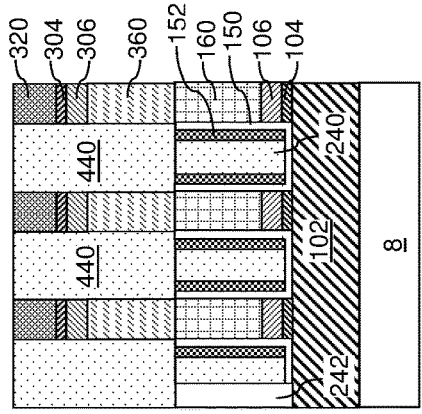
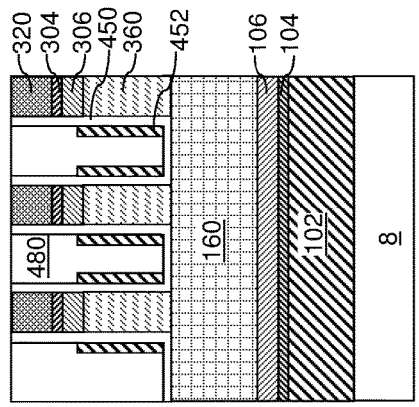
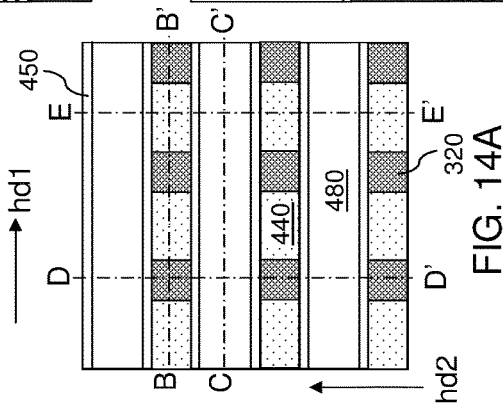

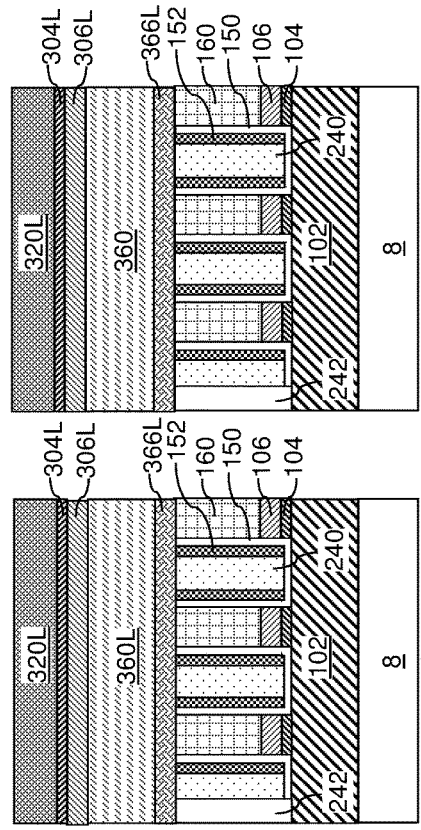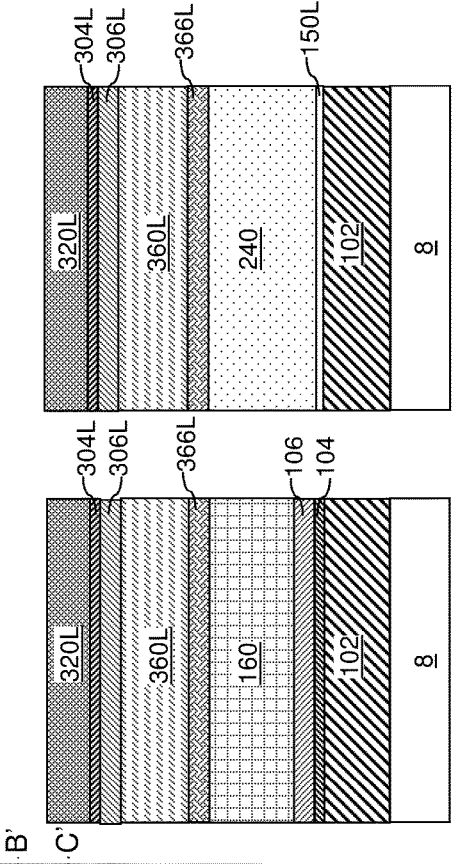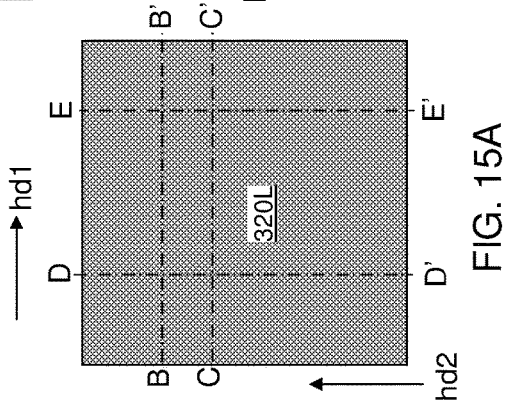

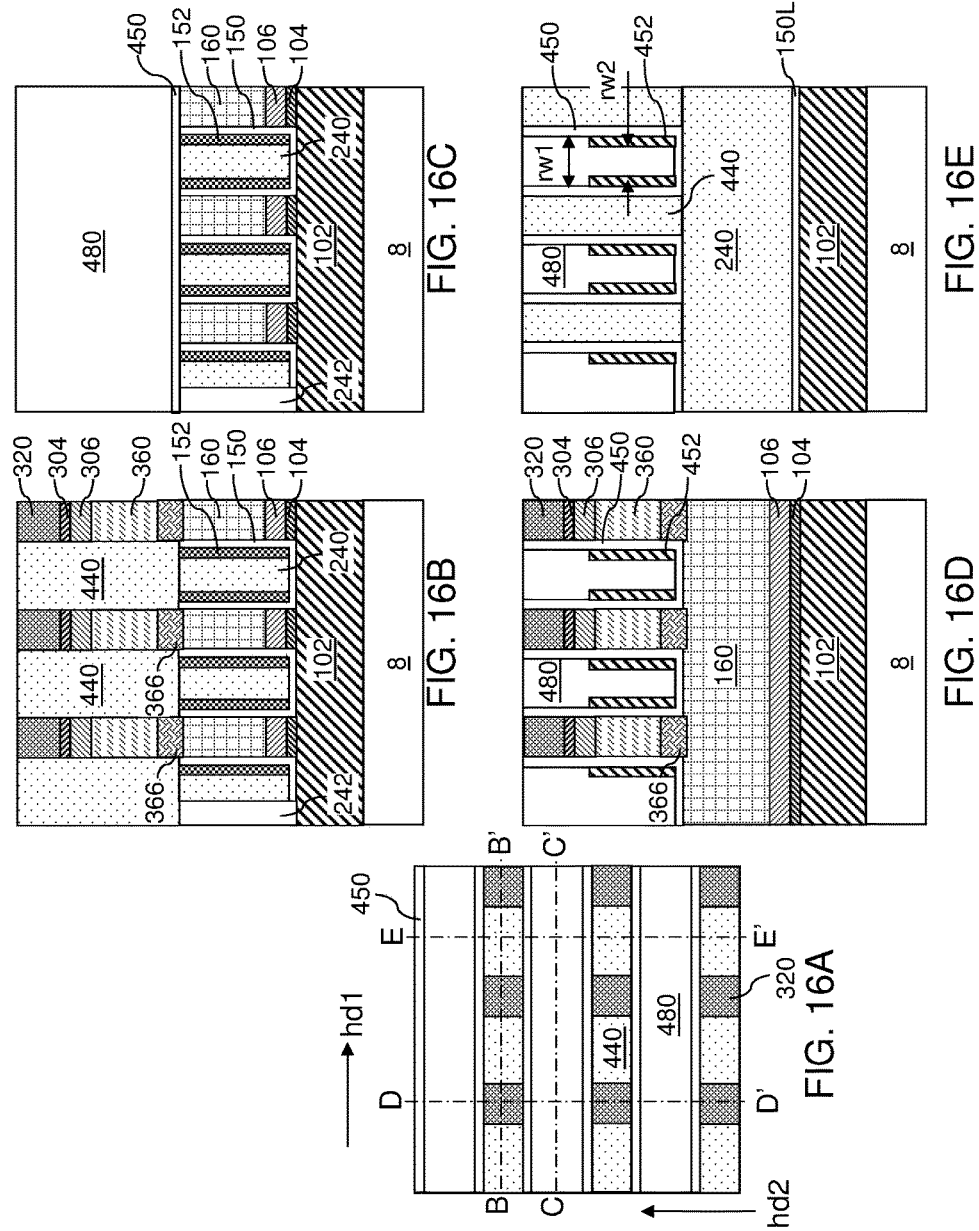

VERTICAL FIELD EFFECT TRANSISTORS INCLUDING TWO-TIER SELECT GATES AND METHOD OF MAKING THE SAME

FIELD

The present disclosure relates generally to the field of semiconductor devices and specifically to a two-dimensional array of field effect transistors including two-tier select gates and methods of manufacturing the same.

BACKGROUND

An illustrative example of a three-dimensional memory device is a three-dimensional resistive random access memory (ReRAM) device, which is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A resistive memory cell can be programmed into a set state having a low electrical resistance, or a reset state having a high resistance. A write operation stores data in a set of resistive memory cells by programming each resistive memory cell into a set state or a reset state depending on the contents of the data. For example, "1" can correspond to a set state and "0" can correspond to a reset state, or vice versa.

SUMMARY

According to an aspect of the present disclosure, a semiconductor structure comprising a two-dimensional array of vertical field effect transistors is provided. The two-dimensional array of vertical field effect transistors comprises: a first-tier structure comprising a laterally alternating sequence of semiconductor rail structures and first dielectric isolation rails that alternates along a first horizontal direction, wherein a first gate dielectric and a first gate electrode that laterally extend along a second horizontal direction are disposed between each neighboring pair of a semiconductor rail structure and a first dielectric isolation rail; and a second-tier structure comprising a laterally alternating sequence of composite rail structures and second dielectric isolation rails that alternates along the second horizontal direction, wherein each of the composite rail structures comprises a laterally alternating plurality of semiconductor pillar structures and dielectric pillar structures, and a second gate dielectric and a second gate electrode that laterally extend along the first horizontal direction are disposed between each neighboring pair of a composite rail structure and a second dielectric isolation rail.

According to another aspect of the present disclosure, a method of forming a semiconductor structure is provided, which comprises the steps of: forming a one-dimensional array of semiconductor rail structures spaced among one another along a first horizontal direction over a substrate, wherein each of the semiconductor rail structures laterally extends along a second horizontal direction; forming first gate dielectrics and first gate electrodes on sidewalls of the semiconductor rail structures; forming first dielectric isolation rails on the first gate electrodes and between neighboring pairs of semiconductor rail structures; forming composite rail structures over the semiconductor rail structures, wherein each of the composite rail structures comprises a laterally alternating plurality of semiconductor pillar structures and dielectric pillar structures; forming second gate dielectrics and second gate electrodes on sidewalls of the composite rail structures; and forming second dielectric isolation rails on the second gate electrodes and between neighboring pairs of composite rail structures.

BRIEF DESCRIPTION OF THE DRAWINGS

FIG. 1A is a top-down view of an exemplary structure after formation of a continuous conductive plate, a first metal nitride layer, a first doped semiconductor material layer, a lower semiconductor channel material layer, a first hard mask layer, a first lithographic material layer, a second lithographic material layer, and a patterned photoresist layer according to an embodiment of the present disclosure.

FIGS. 1B-1E are vertical cross-sectional views of the exemplary structure along the vertical planes B-B', C-C', D-D', and E-E' of FIG. 1A, respectively.

FIG. 2A is a top-down view of an exemplary structure after formation of a one-dimensional array of rail structure stacks by an anisotropic etch according to an embodiment of the present disclosure.

FIGS. 2B-2E are vertical cross-sectional views of the exemplary structure along the vertical planes B-B', C-C', D-D', and E-E' of FIG. 2A, respectively.

FIG. 3A is a top-down view of an exemplary structure after formation of a first gate dielectric layer and first gate electrodes according to an embodiment of the present disclosure.

FIGS. 3B-3E are vertical cross-sectional views of the exemplary structure along the vertical planes B-B', C-C', D-D', and E-E' of FIG. 3A, respectively.

FIG. 4A is a top-down view of an exemplary structure after deposition of a first dielectric fill material layer according to an embodiment of the present disclosure.

FIGS. 4B-4E are vertical cross-sectional views of the exemplary structure along the vertical planes B-B', C-C', D-D', and E-E' of FIG. 4A, respectively.

FIG. 6A is a top-down view of an exemplary structure after deposition and planarization of a planarization dielectric layer according to an embodiment of the present disclosure.

FIGS. 6B-6E are vertical cross-sectional views of the exemplary structure along the vertical planes B-B', C-C', D-D', and E-E' of FIG. 6A, respectively.

FIG. 7A is a top-down view of an exemplary structure after formation of an upper semiconductor channel material layer, a second doped semiconductor layer, a second metal nitride layer, and a second hard mask layer according to an embodiment of the present disclosure.

FIGS. 7B-7E are vertical cross-sectional views of the exemplary structure along the vertical planes B-B', C-C', D-D', and E-E' of FIG. 7A, respectively.

FIG. 8A is a top-down view of an exemplary structure after application and patterning of a photoresist layer according to an embodiment of the present disclosure.

FIGS. 8B-8E are vertical cross-sectional views of the exemplary structure along the vertical planes B-B', C-C', D-D', and E-E' of FIG. 8A, respectively.

FIG. 9A is a top-down view of an exemplary structure after formation of semiconductor material rails by patterning the second doped semiconductor layer and the upper semiconductor channel material layer according to an embodiment of the present disclosure.

FIGS. 9B-9E are vertical cross-sectional views of the exemplary structure along the vertical planes B-B', C-C', D-D', and E-E' of FIG. 9A, respectively.

FIG. 10A is a top-down view of an exemplary structure after formation of dielectric material rails according to an embodiment of the present disclosure.

FIGS. 10B-10E are vertical cross-sectional views of the exemplary structure along the vertical planes B-B', C-C', D-D', and E-E' of FIG. 10A, respectively.

FIG. 11A is a top-down view of an exemplary structure after application and patterning of a photoresist layer according to an embodiment of the present disclosure.

FIGS. 11B-11E are vertical cross-sectional views of the exemplary structure along the vertical planes B-B', C-C', D-D', and E-E' of FIG. 11A, respectively.

FIG. 12A is a top-down view of an exemplary structure after patterning the semiconductor material rails and the dielectric material rails into composite rail structures each including a laterally alternating plurality of semiconductor pillar structures and dielectric pillar structures according to an embodiment of the present disclosure.

FIGS. 12B-12E are vertical cross-sectional views of the exemplary structure along the vertical planes B-B', C-C', D-D', and E-E' of FIG. 12A, respectively.

FIG. 13A is a top-down view of an exemplary structure after formation of a second gate dielectric layer and second gate electrodes according to an embodiment of the present disclosure.

FIGS. 13B-13E are vertical cross-sectional views of the exemplary structure along the vertical planes B-B', C-C', D-D', and E-E' of FIG. 13A, respectively.

FIG. 14A is a top-down view of an exemplary structure after formation of second dielectric isolation rails according to an embodiment of the present disclosure.

FIGS. 14B-14E are vertical cross-sectional views of the exemplary structure along the vertical planes B-B', C-C', D-D', and E-E' of FIG. 14A, respectively.

FIG. 15A is a top-down view of an alternative embodiment of the exemplary structure after formation of a middle doped semiconductor material layer, an upper semiconductor channel material layer, a second doped semiconductor layer, a second metal nitride layer, and a second hard mask layer.

FIGS. 15B-15E are vertical cross-sectional views of the alternative embodiment of the exemplary structure along the vertical planes B-B', C-C', D-D', and E-E' of FIG. 15A, respectively.

FIG. 16A is a top-down view of an alternative embodiment of the exemplary structure after formation of second dielectric isolation rails.

FIGS. 16B-16E are vertical cross-sectional views of the alternative embodiment of the exemplary structure along the vertical planes B-B', C-C', D-D', and E-E' of FIG. 16A, respectively.

DETAILED DESCRIPTION

Figure 5B:
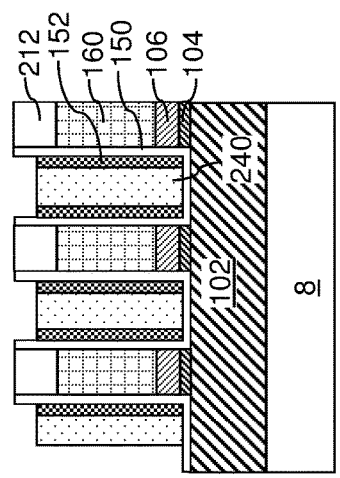
FIGS. 5B-5E are vertical cross-sectional views of the exemplary structure along the vertical planes B-B', C-C', D-D', and E-E' of FIG. 5A, respectively.
Figure 5C:
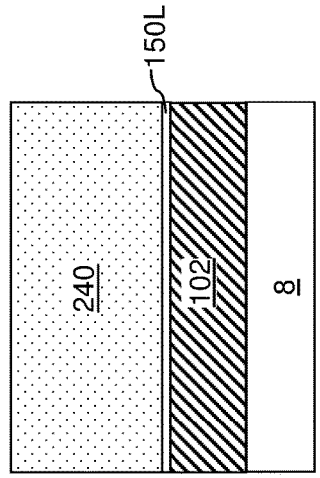
Figure 5D:
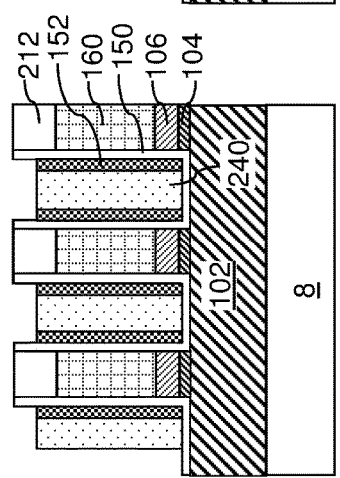
Figure 5E:
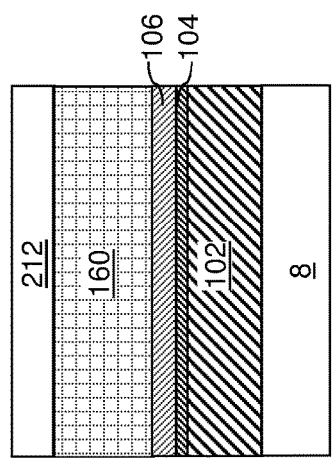
Figure 5A:
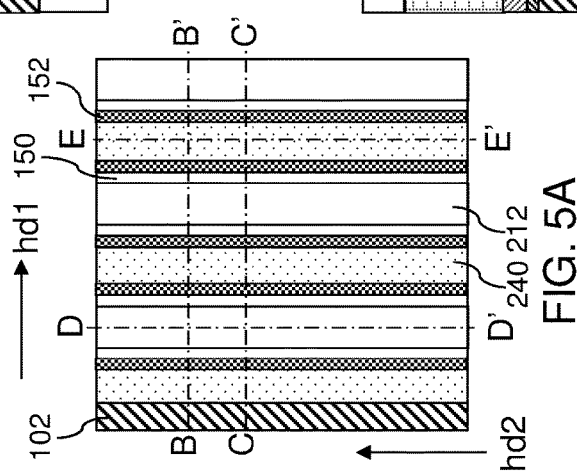
FIG. 5A is a top-down view of an exemplary structure after formation of first dielectric isolation rails by recessing the first dielectric fill material layer according to an embodiment of the present disclosure.

As discussed above, the present disclosure is directed to a two-dimensional array of field effect transistors including two-tier select gates and methods of manufacturing the same, the various aspects of which are described below. The embodiments of the disclosure can be employed to form various semiconductor devices, such as three-dimensional monolithic memory array devices comprising ReRAM devices, that include a two-dimensional array of vertical field effect select transistors. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material"

or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

Referring to FIGS. 1A-1E, an exemplary structure according to an embodiment of the present disclosure is illustrated, which includes a substrate 8 including an electrically insulating material at an upper portion thereof. The substrate 8 may comprise a semiconductor (e.g., silicon) wafer and may further include a semiconductor (e.g., silicon) layer (not expressly shown) and semiconductor devices (not expressly shown) thereupon. The semiconductor devices can include, for example, field effect transistors. The substrate 8 can further include metal interconnect structures (not expressly shown), which can include metal lines and metal via structures embedded in interconnect level dielectric material layers and provide various electrical connections among the semiconductor devices.

A continuous conductive plate 102 can be formed on a topmost insulating layer of the substrate 8. The continuous conductive plate 102 can laterally extend over a device region in which a two-dimensional array of vertical field effect transistors is to be subsequently formed. The continuous conductive plate 102 can function as a common bottom electrode (e.g., global bit line) for the two-dimensional array of vertical field effect transistors. One continuous conductive plate 102 can be provided per two-dimensional array of vertical field effect transistors. Thus, if multiple two-dimensional arrays of vertical field effect transistors are to be formed, multiple continuous conductive plates 102 can be formed as a one-dimensional array or as a two-dimensional array. Each continuous conductive plate 102 can be electrically connected to a respective one of the semiconductor devices in or on the substrate 8 through a respective subset of the metal interconnect structures. Each continuous conductive plate 102 can include a conductive material, which can be an elemental metal (e.g., tungsten), an intermetallic alloy, a heavily doped (conductive) semiconductor material, a conductive metallic compound (such as a conductive metal nitride), and/or a stack or multiple instances thereof. The thickness of the continuous conductive plate 102 can be in a range from 10 nm to 300 nm, although lesser and greater thicknesses can also be employed.

An optional first metal nitride layer 104L, a first doped semiconductor layer 106L, a lower semiconductor channel material layer 160L, a first hard mask layer 212L, an optional first lithographic material layer 214L, an optional second lithographic material layer 216L, and a patterned photoresist layer 217 can be sequentially deposited over the continuous conductive plate 102. The optional first metal nitride layer 104L, if present, includes a metallic material, which can include, for example, titanium nitride, tantalum nitride layer, or tungsten nitride layer.

The first doped semiconductor layer 106L can include doped polysilicon or doped amorphous silicon (that can be subsequently converted into doped polysilicon through an anneal) having a doping of a first conductivity type (which can be p-type or n-type). The lower semiconductor channel material layer 160L includes an intrinsic semiconductor material or a semiconductor material having a doping of a second conductivity type, which is the opposite of the first conductivity type. For example, if the first conductivity type is p-type, the second conductivity type is n-type, and vice versa. The first doped semiconductor channel layer 106L has a higher dopant concentration than the dopant concentration in the lower semiconductor channel material layer 160L. The thickness of the first metal nitride layer 104L can be in a range from 3 nm to 30 nm, the thickness of the first doped semiconductor layer 106L can be in a range from 10 nm to 40 nm, and the thickness of the lower semiconductor channel material layer 160L can be in a range from 50 nm to 500 nm, such as from 100 nm to 300 nm, although lesser and greater thicknesses can also be employed.

The first hard mask layer 212L includes a hard mask material that can be employed as a stopping layer during a subsequent planarization process. For example, the first hard mask layer 212L can include silicon oxide or silicon nitride. The optional first lithographic material layer 214L and the optional second lithographic material layer 216L, if present, include lithographic materials that can enhance lithographic patterning of the photoresist layer 217. For example, the first lithographic material layer 214L can include amorphous carbon that can be deposited by chemical vapor deposition, and the second lithographic material layer 216L can include a spin-on glass (SOG) material that can be deposited by spin coating.

A photoresist material can be applied over the first hard mask layer 212L and the optional lithographic material layers (214L, 216L), and can be lithographically patterned, by exposure and development, to form the patterned photoresist layer 217. The patterned photoresist layer 217 can have a line and space pattern in which the patterned portions of the photoresist material have a uniform width along the first horizontal direction hd1 and laterally extend along a second horizontal direction hd2 that is perpendicular to the first horizontal direction hd1. Line trenches having a respective uniform width can laterally extend along the second horizontal direction hd2 between each neighboring pairs of patterned photoresist material portions having substantially vertical sidewalls.

Referring to FIGS. 2A-2E, the pattern in the photoresist layer 217 can be transferred through the layer stack of the second and first lithographic material layers (216L, 214L), the first hard mask layer 212L, the lower semiconductor channel material layer 160L, the first doped semiconductor layer 106L, and the first metal nitride layer 104L by an anisotropic etch. The etch chemistry of the anisotropic etch can be adjusted to sequentially etch through the various layers within the layer stack. Line trenches 219 having a pair of parallel lengthwise sidewalls can be formed between each neighboring pair of first rail structure stacks (104, 106, 160, 212, 214, 216), which are remaining portions of the various layers in the layer stack. As used herein, a "rail" or a "rail structure" refers to a structure that laterally extends in a lengthwise direction with a uniform cross-sectional shape along planes that are perpendicular to the lengthwise direction. The material composition within a rail may, or may not, be uniform along the lengthwise direction of the rail. In one embodiment, the rail stack structures (104, 106, 160, 212, 214, 216) can be formed as a one-dimensional array of semiconductor rail structures (104, 106, 160, 212, 214, 216) spaced among one another along the first horizontal direction hd1 and laterally extend along the second horizontal direction hd2.

Each first rail structure stack (104, 106, 160, 212, 214, 216) can include, from bottom to top, a metal nitride rail 104 which is a remaining portion of the first metal nitride layer 104L, an active region rail 106 which is a remaining portion of the first doped semiconductor layer 106L, a semiconductor channel rail 160 which is a remaining portion of the lower semiconductor channel material layer 160L, a first hard mask rail 212 which is a remaining portion of the first hard mask layer 212L, an optional first lithographic material rail 214 which is a remaining portion of the optional first lithographic material layer 214L, and an optional second lithographic material rail 216 which is a remaining portion of the optional second lithographic material layer 216L. The first rail structure stacks (104, 106, 160, 212, 214, 216) can be formed as a one-dimensional periodic array of first rail structure stacks (104, 106, 160, 212, 214, 216) having a periodicity along the first horizontal direction.

Each vertically neighboring pair of an active rail region 106 and a semiconductor channel rail 160 constitutes a semiconductor rail structure (106, 160). Each of the active region rails 106 can be electrically shorted to the continuous conductive plate 102 through a respective one of the metal nitride rails 104 or, in case the metal nitride rails 104 are omitted, by directly contacting the top surface of the continuous conductive plate 102. Each lengthwise sidewall of component rails in a first rail structure stack (104, 106, 160, 212, 214, 216) can be vertically coincident with sidewalls of any overlying component rail therein (if present) and with sidewalls of any underlying component rail therein (if present). As used herein, a first surface and a second surface can be vertically coincident with each other if the second surface overlies or underlies the first surface and if there exists a vertical plane including the first surface and the second surface. In one embodiment, each component rail in a first rail structure stack (104, 106, 160, 212, 214, 216) can have a rectangular vertical cross-sectional shape.

The patterned photoresist layer 217 and the optional first and second lithographic material rails (214, 216) can be subsequently removed.

Referring to FIGS. 3A-3E, a first gate dielectric layer 150L can be formed in the line trenches 219 on the sidewalls of the one-dimensional array of semiconductor rail structures (106, 160) and on physically exposed portions of the top surface of the continuous conductive plate 102. The first gate dielectric layer 150L can be formed on the sidewalls of a metal nitride rail 104, an active region rail 106, a semiconductor channel rail 160, and a first hard mask rail 212. The first gate dielectric layer 150L can include any gate dielectric material known in the art including, but not limited to, silicon oxide, silicon oxynitride, a dielectric metal oxide, or a stack thereof. In one embodiment, the first gate dielectric layer 150L can be deposited as a continuous material layer having a uniform thickness by at least one conformal deposition process such as chemical vapor deposition and atomic layer deposition.

A first gate electrode material layer including a conductive material can be deposited over the first gate electrode material layer 150L in the line trenches 219. The first gate electrode material layer can include any of the gate electrode materials known in the art such as a conductive metal nitride (e.g., TiN), a heavily doped (conductive) semiconductor material, an elemental metal or an intermetallic alloy, or a stack thereof. The thickness of the first gate electrode material layer can be less than one half of the lateral width of the remaining volume of a line trench between a neighboring pair of rail structure stacks (104, 106, 160, 212). For example, the thickness of the first gate electrode material layer can be in a range from 3 nm to 100 nm, such as from 6 nm to 50 nm, although lesser and greater thicknesses can also be employed.

An anisotropic etch process can be performed to remove horizontal portions of the first gate electrode material layer. Each remaining vertical portion of the first gate electrode material layer constitutes a first gate electrode 152, which has a uniform width and laterally extends along the second horizontal direction hd2. The top surface of each first gate electrode 152 can be located adjacent to a sidewall of a first hard mask rail 212.

Referring to FIGS. 4A-4E, a first dielectric fill material layer 240L is formed by depositing a first dielectric fill material in each unfilled volume of the line trenches 219 separating the one-dimensional array of rail structure stacks (104, 106, 160, 212). The dielectric material of the first dielectric fill material layer 240L can be undoped silicate glass (USG) or doped silicate glass such as phosphosilicate glass or borosilicate glass.

Referring to FIGS. 5A-5E, the first dielectric fill material layer 240L can be optionally vertically recessed by an anisotropic etch process. Remaining portions of the first dielectric fill material layer constitute first dielectric isolation rails 240. The top surfaces of the first dielectric isolation rails 240 can be formed between a horizontal plane including the top surfaces of the first hard mask rails 212 and a horizontal plane including the bottom surfaces of the first hard mask rails 212. Horizontal portions of the first gate dielectric layer 150L overlying the first hard mask rails 212 can be collaterally removed during recessing of the first dielectric fill material layer 240L. Each remaining portion of the first gate dielectric layer 150L constitutes a first gate dielectric 150. Each first gate dielectric 150 can be U-shaped, and can include a horizontal portion contacting a top surface of the continuous conductive plate 102 and a pair of vertical portions that laterally extend along the second horizontal direction hd2 and adjoined to the lengthwise edges of the horizontal portion.

In one embodiment, top surfaces of the first hard mask rails 212 may be vertically recessed. In one embodiment, the first dielectric fill material layer 240L can include a dielectric material having a greater etch rate than the dielectric material of the first hard mask rails 212. For example, the first dielectric fill material layer 240L can include borosilicate glass, phosphosilicate glass, or borophosphosilicate glass, and the first hard mask rails 212 can include undoped silicate glass or silicon nitride. In this case, a wet etch process employing hydrofluoric acid can be employed to recess the top surfaces of the first dielectric isolation rails 240 below the horizontal plane including the top surfaces of the first hard mask rails 212.

Protruding portions of the first gate electrodes 152 can be removed, for example, by an isotropic etch, which may, or may not, be selective to the material of the first gate dielectrics 150. In this case, top surfaces of the first gate electrodes 152 can be formed at the same height as the top surfaces of the first dielectric isolation rails 240. Each first dielectric isolation rail 240 can be formed on a neighboring pair of first gate electrodes 152 that is located between a neighboring pair of semiconductor rail structures (106, 160). A pair of first gate dielectrics 150 and a pair of first gate electrodes 152 can be formed on a pair of sidewalls of each semiconductor rail structure (106, 160).

Referring to FIGS. 6A-6E, a planarizable dielectric material such as silicon oxide can be deposited outside each array of semiconductor rail structures (106, 160) and/or in each area that is not covered by the semiconductor rail structures (106, 160) and the first gate dielectrics 150. A planarization process can be performed to remove the first hard mask rails 212 and excess portions of the deposited planarizable dielectric material from above a horizontal plane including the top surfaces of the semiconductor rail structures (106, 160). The planarization process can employ, for example, chemical mechanical planarization and/or a recess etch. In one embodiments, top surfaces of the semiconductor rail structures (106, 160) can be coplanar with the top surfaces of the first gate dielectrics 150, the first gate electrodes 152, the first dielectric isolation rails 240, and remaining portions of the planarization dielectric material, which are collectively referred to as a planarization dielectric layer 242. The collection of all structures formed above the horizontal plane including the top surface of the continuous conductive plate 102 by this processing step constitutes a first-tier structure (104, 106, 160, 150, 152, 240, 242).

Referring to FIGS. 7A-7E, an upper semiconductor channel material layer 360L, a second doped semiconductor layer 306L, an optional second metal nitride layer 304L, and a second hard mask layer 320L can be sequentially formed over the one-dimensional array of semiconductor rail structures (106, 160). The upper semiconductor channel material layer 360L includes an intrinsic semiconductor material or a semiconductor material having a doping of the second conductivity type, which is the same conductivity type as the doping of the semiconductor channel rails 160. The thickness of the upper semiconductor channel material layer 360L can be in a range from 50 nm to 500 nm, such as from 100 nm to 300 nm, although lesser and greater thicknesses can also be employed.

The second doped semiconductor layer 306L can include doped polysilicon or doped amorphous silicon (that can be subsequently converted into doped polysilicon through an anneal) having a doping of the first conductivity type. The thickness of the second doped semiconductor layer 306L can be in a range from 10 nm to 40 nm, although lesser and greater thicknesses can also be employed.

The optional second metal nitride layer 304L, if present, includes a metallic material, which can include, for example, titanium nitride, tantalum nitride layer, or tungsten nitride layer. The thickness of the second metal nitride layer 304L can be in a range from 3 nm to 30 nm, although lesser and greater thicknesses can also be employed.

The second hard mask layer 320L includes a hard mask material that can be employed as a stopping layer during a subsequent planarization process. For example, the second hard mask layer 320L can include silicon oxide or silicon nitride.

Referring to FIGS. 8A-8E, a photoresist material can be applied over the second hard mask layer 320L, and can be lithographically patterned, by exposure and development, to form a patterned photoresist layer 417. The patterned photoresist layer 417 can have a line and space pattern in which the patterned portions of the photoresist material have a uniform width along the first horizontal direction hd1 and laterally extend along the second horizontal direction hd2. Line trenches having a respective uniform width can laterally extend along the second horizontal direction hd2 between each neighboring pairs of patterned photoresist material portions having substantially vertical sidewalls. In one embodiment, the pattern of the photoresist layer 417 may be the same as the pattern of the photoresist layer 217 employed at the processing steps of FIGS. 1A-1E. The width of each line portion of the photoresist layer 417 (as measured along the first horizontal direction hd1) may be optimized as needed. Thus, each patterned line portions of the photoresist layer 417 can overlap in area with a respective one of the semiconductor rail structures (106, 160).

Referring to FIGS. 9A-9E, the pattern in the photoresist layer 417 can be transferred through the layer stack of the second hard mask layer 320L, the second metal nitride layer 304L, the second doped semiconductor layer 306L, and the upper semiconductor channel material layer 360L by an anisotropic etch. The etch chemistry of the anisotropic etch can be adjusted to sequentially etch through the various layers within the layer stack. The last step of the anisotropic etch process that etches through the upper semiconductor channel material layer 360L can be selective to the materials of the first gate electrodes 152. Line trenches having a pair of parallel lengthwise sidewalls can be formed between each neighboring pair of second rail structure stacks (360R, 306R, 304R, 320R), which are remaining portions of the various layers in the layer stack. In one embodiment, the second rail stack structures (360R, 306R, 304R, 320R) can be formed as a one-dimensional array of second semiconductor rail structures (360R, 306R, 304R, 320R) spaced among one another along the first horizontal direction hd1 and laterally extend along the second horizontal direction hd2.

Each second rail structure stack (360R, 306R, 304R, 320R) can include, from bottom to top, an upper semiconductor channel rail 360R which is a remaining portion of the upper semiconductor channel material layer 360L, an upper active region rail 306R which is a remaining portion of the second doped semiconductor layer 306L, an upper metal nitride rail 304R which is a remaining portion of the second metal nitride layer 304, and a second hard mask rail 320R which is a remaining portion of the second hard mask layer 320L. The second rail structure stacks (360R, 306R, 304R, 320R) can be formed as a one-dimensional periodic array of second rail structure stacks having the same periodicity as the one-dimensional periodic array of first semiconductor rail structures (106, 160). Each vertical stack of an upper semiconductor channel rail 360R and an upper active region rail 306R constitutes a semiconductor material rail (360R, 306R), which consists essentially of doped semiconductor materials and includes a p-n junction therein.

Each vertically neighboring pair of an upper active region 306R and an upper semiconductor channel rail 360R constitutes an upper semiconductor rail structure (306R, 360R). Each lengthwise sidewall of component rails in a second rail structure stack (360R, 306R, 304R, 320R) can be vertically coincident with sidewalls of any overlying component rail therein (if present) and with sidewalls of any underlying component rail therein (if present). In one embodiment, each component rail in a second rail structure stack (360R, 306R, 304R, 320R) can have a respective rectangular vertical cross-sectional shape. The patterned photoresist layer 417 can be subsequently removed, for example, by ashing.

Referring to FIGS. 10A-10E, a dielectric fill material can be deposited in each unfilled volume of the line trenches among the one-dimensional array of second rail structure stacks (360R, 306R, 304R, 320R). The dielectric fill material can be undoped silicate glass (USG) or doped silicate glass such as phosphosilicate glass or borosilicate glass. The dielectric fill material can be planarized by a planarization process such as chemical mechanical planarization and/or a recess etch. The second hard mask rails 320R can be employed as stopping structures during the planarization process. Each remaining portion of the dielectric fill material constitutes a dielectric material rail 440R. In one embodiment, the top surfaces of the dielectric material rails 440R can be coplanar with the top surfaces of the second hard mask rails 320R. A laterally alternating sequence of semiconductor material rails (360R, 306R) and dielectric material rails 440R that alternate along the first horizontal direction hd1 is formed over the one-dimensional array of the semiconductor rail structures (106, 160) and the first dielectric isolation rails 240. The top surfaces of the first dielectric isolation rails 240 can be coplanar with the top surfaces of the second hard mask rails 320R.

Referring to FIGS. 11A-11E, a photoresist material can be applied over the laterally alternating sequence of semiconductor material rails (360R, 306R) and dielectric material rails 440R, and can be lithographically patterned, by exposure and development, to form a patterned photoresist layer 517. The patterned photoresist layer 517 can have a line and space pattern in which the patterned portions of the photoresist material have a uniform width along the second horizontal direction hd2 and laterally extend along the first horizontal direction hd1. Line trenches having a respective uniform width can laterally extend along the first horizontal direction hd1 between each neighboring pairs of patterned photoresist material portions having substantially vertical sidewalls.

Referring to FIGS. 12A-12E, the pattern in the photoresist layer 517 can be transferred through the laterally alternating sequence of semiconductor material rails (360R, 306R) and dielectric material rails 440R by an anisotropic etch. The etch chemistry of the anisotropic etch can be adjusted to indiscriminately etch through the laterally alternating sequence of semiconductor material rails (360R, 306R) and dielectric material rails 440R, or to sequentially etch through the various component material portions of the laterally alternating sequence of semiconductor material rails (360R, 306R) and dielectric material rails 440R. The duration of steps of the anisotropic etch process can be selected such that the line trenches formed through the laterally alternating sequence of semiconductor material rails (360R, 306R) and dielectric material rails 440R have bottom surfaces at, or below, the top surfaces of the semiconductor channel rails 160.

Line trenches having a pair of parallel lengthwise sidewalls can be formed between each neighboring contiguous set of remaining material portions. The remaining material portions can include a two-dimensional array of dielectric pillar structures 440, each of which is a remaining discrete portion of a dielectric material rail 440R. As used herein, a "pillar" or a "pillar structure" refers to a structure having a uniform horizontal cross-sectional shape that is independent of the height of the plane of the horizontal cross-sectional view. Each divided portion of the dielectric material rails 440R constitutes a dielectric pillar structure 440. Each dielectric material rail 440R can be divided into a one-dimensional array of dielectric pillar structures 440 that are arranged in a row that extends along the first horizontal direction hd1. Further, a two-dimensional array of pillar stacks (360, 306, 304, 320) can be formed from the remaining portions of the second rail structure stacks (360R, 306R, 304R, 320R). Each two-dimensional array of pillar stacks (360, 306, 304, 320) includes, from bottom to top, a semiconductor channel pillar 360, an active region portion 306, a metal nitride portion 304, and a hard mask portion 320.

Each semiconductor channel pillar 360 is a remaining portion of an upper semiconductor channel rail 360R. In other words, each divided portion of the upper semiconductor material rails 360R constitutes a semiconductor pillar structure 360. Each active region portion 306 is a remaining portion of an upper active region rail 306R. Each metal nitride portion 304 is a remaining portion of an upper metal nitride rail 304R. Each hard mask portion 320 is a remaining portion of a second hard mask rail 320R. Each upper semiconductor channel rail 360R can be divided into a one-dimensional array of semiconductor channel pillars 360 that are arranged in a respective row that extend along the first horizontal direction hd1. Each upper active region rail 306R can be divided into a one-dimensional array of active region portions 306 that are arranged in a respective row that extend along the first horizontal direction hd1. Each upper metal nitride rail 304R can be divided into a one-dimensional array of metal nitride portions 304 that are arranged in a respective row that extend along the first horizontal direction hd1. Each second hard mask rail 320R can be divided into a one-dimensional array of hard mask portions 320 that are arranged in a respective row that extend along the first horizontal direction hd1.

The two-dimensional array of dielectric pillar structures 440 and the two-dimensional array of pillar stacks (360, 306, 304, 320) can be interlaced with a lateral offset along the first horizontal direction hd1 by one half of the pitch of each of the two-dimensional arrays. Each of the two-dimensional array of dielectric pillar structures 440 and the two-dimensional array of pillar stacks (360, 306, 304, 320) can have a periodicity along the first horizontal direction hd1 that is the same as the periodicity of the one-dimensional periodic array of first semiconductor rail structures (106, 160) along the first horizontal direction hd1.

In one embodiment, the sidewalls of each pillar stack (360, 306, 304, 320) can be vertical. In this case, each component pillar structure within a pillar stack (360, 306, 304, 320) can have the same horizontal cross-sectional shape that is independent of the height of the horizontal cross-sectional view. In this case, the sidewalls of the component pillars within each pillar stack (360, 306, 304, 320), i.e., a stack of a semiconductor channel pillar 360, an active region portion 306, a metal nitride portion 304, and a hard mask portion 320, can be vertically coincident among one another. The line trenches formed through the laterally alternating sequence of semiconductor material rails (360R, 306R) and dielectric material rails 440R have bottom surfaces at, or below, the top surfaces of the semiconductor channel rails 160. Thus, each semiconductor channel pillar 360 can be formed as a discrete structure that is laterally spaced from other semiconductor channel pillars 360 by the line trenches or by the dielectric pillar structures 440.

Each vertical stack of a semiconductor channel pillar 360 and an active region portion 306 constitutes a semiconductor pillar structure (360, 306). Within each semiconductor pillar structures (360, 306), the semiconductor channel pillar 360 includes a doped semiconductor material having a doping of the second conductivity type, and the active region portion 306 has a doping of the first conductivity type at a dopant concentration that is greater than the dopant concentration in the semiconductor channel pillar 360.

Each contiguous set of dielectric pillar structures 440 and pillar stacks (360, 306, 304, 320) that laterally extend along the first horizontal direction hd1 constitutes a composite rail structure (440, 360, 306, 304, 320). As such, each composite rail structure (440, 360, 306, 304, 320) can include a laterally alternating plurality of semiconductor pillar structures (360, 306) and dielectric pillar structures 440. The composite rail structures (440, 360, 306, 304, 320) can be arranged as a one-dimensional periodic array in which instances of the composite rail structures (440, 360, 306, 304, 320) are repeated along the second horizontal direction hd2. The one-dimensional periodic array of composite rail structures (440, 360, 306, 304, 320) that are repeated along the second horizontal direction hd2 can be formed over the one-dimensional array of semiconductor rail structures (104, 106, 160, 212, 214, 216) spaced among one another along the first horizontal direction hd1. The patterned photoresist layer 517 can be subsequently removed, for example, by ashing.

Referring to FIGS. 13A-13E, a second gate dielectric layer 450L can be formed on the sidewalls of the one-dimensional array of composite rail structures (440, 360, 306, 304, 320) and on physically exposed portions of the top surface of the first-tier structure (104, 106, 160, 150, 152, 240, 242). Thus, the second gate dielectric layer 450L can be formed on the sidewalls of each of the semiconductor channel pillars 360, the active region portions 306, the metal nitride portions 304, the hard mask portions 320, and the dielectric pillar structures 440. Thus, the second gate dielectric layer 450L can be formed on the sidewalls of the composite rail structures (440, 360, 306, 304, 320) and on top surfaces of the semiconductor rail structures (106, 160) and the first dielectric isolation rails 240. The second gate dielectric layer 450L can include any gate dielectric material known in the art including, but not limited to, silicon oxide, silicon oxynitride, a dielectric metal oxide, or a stack thereof. In one embodiment, the second gate dielectric layer 450L can be deposited as a continuous material layer having a uniform thickness by at least one conformal deposition process such as chemical vapor deposition and atomic layer deposition.

A second gate electrode material layer including a conductive material can be deposited over the second gate dielectric layer 450L. The second gate electrode material layer can include any of the gate electrode materials known in the art such as a conductive metal nitride (e.g., TiN), a heavily doped (conductive) semiconductor material, an elemental metal or an intermetallic alloy, or a stack thereof. The thickness of the second gate electrode material layer can be less than one half of the lateral width of the remaining volume of a line trench between a neighboring pair of composite rail structures (440, 360, 306, 304, 320). For example, the thickness of the second gate electrode material layer can be in a range from 3 nm to 400 nm, such as from 6 nm to 50 nm, although lesser and greater thicknesses can also be employed.

An anisotropic etch process can be performed to remove horizontal portions of the second gate electrode material layer. Each remaining vertical portion of the second gate electrode material layer constitutes a second gate electrode 452, which has a uniform width and laterally extends along the first horizontal direction hd1. The top surface of each second gate electrode 452 can be located on sidewalls of the hard mask portions 320 that are arranged in a row extending along the first horizontal direction hd1.

Referring to FIGS. 14A-14E, a second dielectric fill material layer is formed by depositing a dielectric material in each unfilled volume of the line trenches among the one-dimensional array of composite rail structures (440, 360, 306, 304, 320). The dielectric material of the second dielectric fill material layer can be undoped silicate glass (USG) or doped silicate glass such as phosphosilicate glass or borosilicate glass. The second dielectric fill material layer can be planarized by a planarization process, which can employ a recess etch and/or chemical mechanical planarization. Remaining portions of the second dielectric fill material layer constitute second dielectric isolation rails 480. Thus, the second dielectric isolation rails 480 can be formed on the second gate electrodes 452 and between neighboring pairs of composite rail structures (440, 360, 306, 304, 320).

The top surfaces of the second dielectric isolation rails 480 can be coplanar with the top surfaces of the hard mask portions 320. Portions of the second gate dielectric layer 450L can be removed from above the horizontal plane including top surfaces of the second dielectric isolation rails 480 and the top surfaces of the hard mask portions 320. Each remaining portion of the second gate dielectric layer 450L constitutes a second gate dielectric 450. Each second gate dielectric 450 can be U-shaped, and can include a horizontal portion contacting a top surface of the first-tier structure (104, 106, 160, 150, 152, 240, 242) and vertical portions that laterally extend along the first horizontal direction hd1 and adjoined to lengthwise edges of the horizontal portion of the second gate dielectric 450. A pair of second gate dielectrics 450 and a pair of second gate electrodes 452 can be formed on a pair of sidewalls of each composite rail structures (440, 360, 306, 304, 320).

A laterally alternating sequence of composite rail structures (440, 360, 306, 304, 320) and second dielectric isolation rails 480 can be formed over the first-tier structure (104, 106, 160, 150, 152, 240, 242). The laterally alternating sequence of composite rail structures (440, 360, 306, 304, 320) and second dielectric isolation rails 480 alternates along the second horizontal direction hd2. The set of all components above the first-tier structure (104, 106, 160, 150, 152, 240, 242) as provided at this processing step constitutes a second-tier structure (360, 306, 304, 320, 440, 450, 452, 480).

In one embodiment shown in FIG. 14E, each of the second dielectric isolation rails 480 comprises an upper second dielectric isolation rail portion having a first rail width (rw1), and a lower second dielectric isolation rail portion having a second rail width (rw2) that is less than the first rail width by twice the second uniform width of the second gate electrodes 452.

In an alternative embodiment, the order of steps shown in FIGS. 1A to 9E is changed to form the in-process device shown in FIGS. 10A to 10E. In this embodiment, a layer stack including the optional first metal nitride layer 104L, the first doped semiconductor layer 106L, and the lower semiconductor channel material layer 160L are sequentially deposited over the continuous conductive plate 102, as shown in FIGS. 1A-1E followed by sequentially depositing the upper semiconductor channel material layer 360L, the second doped semiconductor layer 306L, the optional second metal nitride layer 304L, and the second hard mask layer 320L over the lower semiconductor channel material layer 160L, as shown in FIGS. 7A-7E. In this embodiment, one or more of the first hard mask layer 212L, the optional first lithographic material layer 214L, and the optional second lithographic material layer 216L, can be omitted.

Then, the patterned photoresist layer 217 can be formed over the layer stack and the layer stack is etched to form the line trenches 219 through the layer stack to expose the continuous conductive plate 102, similar to the step shown in FIGS. 2A-2E.

The first gate dielectric layer 150L and the first gate electrodes 152 are then formed in the line trenches 219 by the method shown in FIGS. 3A-3E.

The first dielectric isolation rails 240 are then formed between the first gate electrodes 152 in the line trenches 219 by the method shown in FIGS. 4A-4E and 5A-5E. The dielectric isolation rails 240 are then recessed in the line trenches 219 by a selective recess etch to have a top surface located in a horizontal plane including the top surfaces of the semiconductor rail structures (106, 160), similar to the step shown in FIGS. 6A-6E. The sides of the first gate electrodes 152 are then also recessed accordingly.

The dielectric material rails 440R are then formed in the line trenches 219 above the recessed dielectric isolation rails 240 and the first gate electrodes 152, by the method shown in FIGS. 10A-10E. This results in the structure shown in FIGS. 10A-10E and the method then proceeds to the step shown in FIGS. 11A-11E. Therefore, the separate photolithography step used to form the patterned photoresist layer 417 in FIGS. 8A-8E and the etching step shown in FIGS. 9A-9E can be eliminated to reduce the number of method steps.

Referring to FIGS. 15A-15E, another alternative embodiment of the exemplary structure can be derived from the exemplary structure of FIGS. 6A-6E by depositing a middle doped semiconductor material layer 366L. The middle doped semiconductor material layer 366L can have a same type of doping as the active region rails 106, and can include any of the doped semiconductor material that can be employed for the active region rails 106. The thickness of the middle doped semiconductor material layer 366 can be in a range from 5 nm to 200 nm, such as from 10 nm to 100 nm, although lesser and greater thicknesses can also be employed.

Subsequently, the processing steps of FIGS. 7A-7E can be performed to form an upper semiconductor channel material layer 360L, a second doped semiconductor layer 306L, an optional second metal nitride layer 304L, and a second hard mask layer 320L. The processing steps of FIGS. 8A-8E, 9A-9E, 10A-10E, 11A-11E, 12A-12E, 13A-13E, and 14A-14E can be performed thereafter to provide the structure illustrated in FIGS. 16A-16E.

Each patterned portion of the middle doped semiconductor material layer 366L constitutes a middle active region 366. In this case, each semiconductor pillar stack can include, from bottom to top, a middle active region 366, a semiconductor channel pillar 360, and an active region portion 306. Each of the middle active regions 366 can have a pillar shape, and can have a same horizontal cross-sectional shape as the horizontal cross-sectional shape of an overlying semiconductor channel pillar 360. In this configuration, each vertical field effect transistor can be a vertical stack of a lower vertical field effect transistor including an active region rail 106 and a middle active region 366 as a combination of a first source region and a first drain region, and an upper vertical field effect transistor including a middle active region 366 and an active region portion 306 as a second source region and a second drain region.

Figure 17:
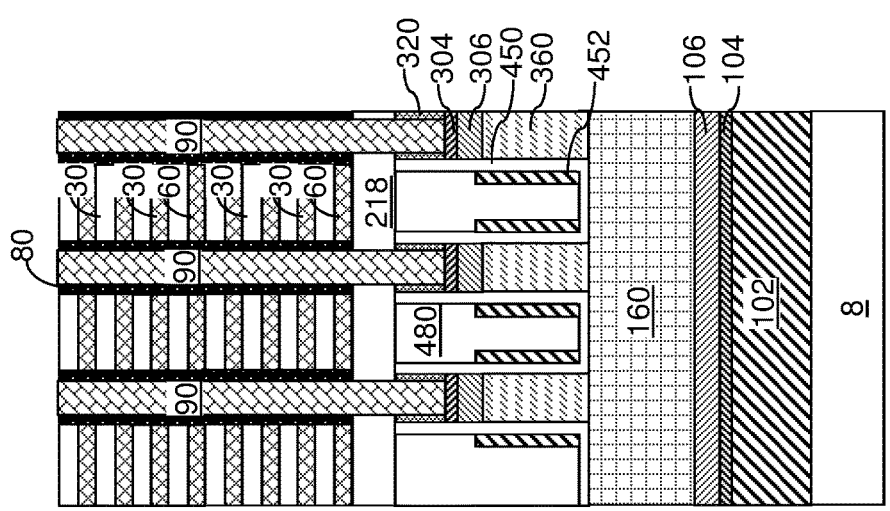
FIG. 17 is a vertical cross-sectional view of the exemplary structure after formation of a plurality of alternating stacks of insulating strips and electrically conductive word line strips over the two-dimensional array of vertical field effect transistors, resistive memory elements, and vertical bit lines according to an embodiment of the present disclosure.

Referring to FIG. 17, a three-dimensional memory array can be formed on the exemplary structure of FIGS. 14A-14E or the exemplary structure of FIGS. 16A-16E. For example, an insulating spacer layer 218 (e.g., silicon nitride) can be formed on any of the first or second exemplary structures. A plurality of alternating stacks (30, 60) of insulating strips 60 and electrically conductive word line strips 30 can be formed over the two-dimensional array of vertical field effect transistors of the exemplary structures described above. Each layer within an alternating stack (30, 60), i.e., each of the insulating strips 60 and the electrically conductive word line strips 30 in the alternating stack (30, 60), can laterally extend along a horizontal direction, which may be selected from the first horizontal direction hd1 and the second horizontal direction hd2. Each neighboring pair of alternating stacks (30, 60) can be laterally spaced from each other by a line trench. The line trenches can form a one-dimensional array that is repeated along a horizontal direction that is perpendicular to the horizontal direction along which the layers within each alternating stack (30, 60) laterally extend. The line trenches can be filled with a two-dimensional array of dielectric pillar structures that defines a two-dimensional array of pillar cavities (i.e., cavities having a respective pillar shape). Each pillar cavity is laterally bounded by a neighboring pair of alternating stacks (30, 60) along one horizontal direction, and is laterally bounded by a neighboring pair of dielectric pillar structures along another horizontal direction.

Resistive memory elements 80 can be formed on the sidewalls of the pillar cavities, i.e., on the sidewalls of the plurality of alternating stacks (30, 60). The resistive memory element 80 material may be selected from: (i) a non-filamentary barrier modulated cell (BMC) which includes a barrier and an electrically conductive metal oxide whose resistivity is switched by at least one of oxygen ion and/or oxygen vacancy diffusion in response to an application of an electric field thereto; (ii) a phase change material portion providing at least two different levels of resistivity that depend on crystallinity; or (iii) a filamentary metal oxide portion (e.g., hafnium oxide layer) providing at least two different levels of resistivity depending on concentration of conductive filaments therein.

Each BMC can include a metal oxide material having at least two resistive states having different resistivity. Examples of metal oxide materials include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0 \times 10^{20}/cm^3$ to $1.0 \times 10^{21}/cm^3$. The memory cell may also include a barrier material, such as amorphous silicon or other suitable barrier materials. An interfacial barrier oxide is located between the metal oxide material and the barrier material. For an amorphous silicon barrier material, the interfacial barrier oxide may comprise silicon oxide.

Without wishing to be bound by a particular theory, it is believed that the BMC ReRAM device operates as follows. The switching mechanism in BMC stack is generally understood as oxygen interstitial (Oi) generation in the interfacial barrier oxide (e.g., $SiO_2$) at the amorphous silicon (a-Si)/$TiO_{2-\delta}$ interface after a reset operation (i.e., resetting the stack into the high resistivity state (HRS)). The oxygen interstitials may drift into defect rich $TiO_{2-\delta}$ where they cause a re-oxidation of the $TiO_{2-\delta}$ (e.g., recombine with oxygen vacancies in the $TiO_{2-\delta}$ near the interface). This re-oxidation decreases the conductivity of the $TiO_{2-\delta}$ material and/or increases the thickness of the insulating interfacial barrier oxide and hence increases the resistance of the BMC memory cell. During the SET operation, opposite voltage is applied across the cell, and Ti—O bonds are supposed to be broken down to generate Oi and Vo (oxygen vacancy) pair in the titanium oxide layer. Oi may drift back to the a-Si/$TiO_{2-\delta}$ interface along the electric field to increase the conductivity of the $TiO_{2-\delta}$ layer and/or decrease the thickness of the insulating interfacial barrier oxide and hence decrease the resistance of the BMC memory cell to set the memory cell into the low resistivity state (LRS).

Without wishing to be bound by a particular theory, it is believed that a BMC ReRAM device may operate based on the principle described above and/or based on an alternative principle instead of or in addition to the principle described above. For example, the BMC ReRAM device may operate by modulation of energy band structure within the cell. When the charge carrier density is modulated, the resistance of the cell is changed. In other words, the resistance of the memory cell may be modulated by changes in the band structure and consequent changes in the charge distribution instead of or in addition to the change in thickness of the interfacial barrier oxide.

Optionally, the resistive memory element 80 may also include an optional steering element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower resistance to the flow of current in one direction, and a higher resistance in the other direction).

Vertical bit lines 90 can be formed in remaining volumes of the pillar cavities. Each vertical bit line 90 can electrically contact a respective one of the top active regions 16, and can be formed between a respective neighboring pair of alternating stacks (30, 60) among the plurality of alternating stacks (30, 60). In one embodiment, the structure formed above the two-dimensional array of vertical field effect transistors can include a three-dimensional array of resistive random access memory (ReRAM) devices.

Generally, resistive memory elements of a resistive random access memory device can be formed on sidewalls of the plurality of alternating stacks (30, 60). Vertical local bit lines 90 contacting a respective one of metal nitride portions 304 (or active region portions 306 in case metal nitride portions 304 are omitted) can be formed between a respective neighboring pair of alternating stacks (30, 60) among the plurality of alternating stacks (30, 60). Each vertical bit line 90 can vertically extend through the insulating spacer layer 218 and a respective one of the hard mask portions 320.

Referring generally to all of the figures of the present disclosure, a semiconductor structure comprising a two-dimensional array of vertical field effect transistors is provided. The two-dimensional array of vertical field effect transistors comprises: a first-tier structure (104, 106, 160, 150, 152, 240, 242) comprising a laterally alternating sequence of semiconductor rail structures (106, 160) and first dielectric isolation rails 240 that alternates along a first horizontal direction hd1, wherein a first gate dielectric 150 and a first gate electrode 152 that laterally extend along a second horizontal direction hd2 are disposed between each neighboring pair of a semiconductor rail structure (106, 160) and a first dielectric isolation rail 240; and a second-tier structure (360, 306, 304, 320, 440, 450, 452, 480) comprising a laterally alternating sequence of composite rail structures (360, 306, 304, 320, 440) and second dielectric isolation rails 480 that alternates along the second horizontal direction hd2, wherein each of the composite rail structures (360, 306, 304, 320, 440) comprises a laterally alternating plurality of semiconductor pillar structures (360, 306, 366) and dielectric pillar structures 440, and a second gate dielectric 450 and a second gate electrode 452 that laterally extend along the first horizontal direction hd1 are disposed between each neighboring pair of a composite rail structure (360, 306, 304, 320, 440) and a second dielectric isolation rail 440.

In one embodiment, wherein each of the semiconductor rail structures (106, 160) comprises: an active region rail 106 comprising a doped semiconductor material having a doping of a first conductivity type; and a semiconductor channel rail 160 comprising a doped semiconductor material having a doping of a second conductivity type that is different from the first conductivity type at a dopant concentration that is less than a dopant concentration in the active region rail.

In one embodiment, each of the semiconductor pillar structures (360, 306, 366) comprises: a semiconductor channel pillar 360 comprising a doped semiconductor material having a doping of the second conductivity type; and an active region portion 306 having a doping of the first conductivity type at a dopant concentration that is greater than a dopant concentration in the semiconductor channel pillar 360.

In one embodiment, the semiconductor structure further comprises a continuous conductive plate 102 located on a substrate 8 and is electrically shorted to each of the active region rails 106. A one-dimensional array of metal nitride rails 104 can be located between the active region rails 106 and the continuous conductive plate 102, wherein sidewalls of the metal nitride rails 104 are vertically coincident with sidewalls of the semiconductor rail structures (106, 160).

In one embodiment a channel of each of the vertical field effect transistors comprises a portion of the semiconductor channel rail 160 which is shared with other vertical field effect transistors located in a same row or column of the two-dimensional array, and the semiconductor channel pillar 360 which has a smaller lateral width than the semiconductor channel rail 160.

In one embodiment, the second gate electrode 452 is located entirely above the first gate electrode 152 such that the first gate electrode and the second gate electrode do not overlap in the vertical direction. Preferably, no charge storage region (e.g., electron or hole storage region, such as a floating gate or silicon nitride charge trapping material) is located between the channel of each of the field effect transistors and the first and the second gate electrode (152, 452).

In one embodiment, each of the first gate dielectrics 150 includes: a pair of vertically extending first gate dielectric portions that extend from a top surface of the continuous conductive plate 102 to bottom surfaces of the second gate dielectrics 450; and a horizontal first gate dielectric portion adjoined to the pair of vertically extending first gate dielectric portions and contacting the top surface of the continuous conductive plate 102. In one embodiment, each of the second gate dielectrics 450 includes: a pair of vertically extending second gate dielectric portions that extend from top surfaces of the semiconductor rail structures (106, 160) to a height above a horizontal plane including top surfaces of the semiconductor pillar structures (360, 306, 366); and a horizontal second gate dielectric portion adjoined to the pair of vertically extending second gate dielectric portions and contacting the top surfaces of the semiconductor rail structures (106, 160).

In one embodiment, the semiconductor structure can further comprise a two-dimensional array of metal nitride portions 304 contacting a respective one of the active region portions 306, wherein sidewalls of the metal nitride portions 304 are vertically coincident with sidewalls of the active region portions 306.

In one embodiment, each of the first dielectric isolation rails 240 contacts bottom surfaces of a respective row of dielectric pillar structures 440 that are arranged along the second horizontal direction hd2.

In one embodiment, each of the first gate electrodes 152 has a first uniform with and contacts bottom surfaces of a respective subset of the dielectric pillar structures 440; and each of the second gate electrodes 452 has a second uniform width and is vertically spaced from the first-tier structure (104, 106, 160, 150, 152, 240, 242) by a horizontal portion of a respective second gate dielectric 450.

In one embodiment, the semiconductor structure further comprises a resistive random access memory (ReRAM) device located over the two dimensional array of vertical field effect transistors. The ReRAM device can comprise: a plurality of alternating stacks of insulating strips 60 and electrically conductive word line strips 30 overlying the two-dimensional array of vertical field effect transistors; vertical local bit lines 90 electrically shorted to a top end of a respective one of the semiconductor pillar structures (360, 306) and vertically extending between a respective neighboring pair of alternating stacks (30, 60) among the plurality of alternating stacks (30, 60); and resistive memory elements 80 located at each intersection between the vertical local bit lines 90 and the plurality of alternating stacks (30, 60).

A two-dimensional array of vertical field effect transistors can be employed as selector devices for a two-dimensional array of vertical conductive lines, such as vertical bit lines, of a three-dimensional memory device. Reliable activation of a selected vertical field effect transistor while suppressing the leakage current through unselected vertical field effect transistors is desired to provide a low power operation of three-dimensional memory devices.

In one embodiment, the active region rails 106 can function as source regions and the active region portions 306 can function as drain regions. Alternatively, the active region rails 106 can function as drain regions and the active region portions 306 can function as source regions.

The dual channel of each transistor includes a portion of a semiconductor channel rail 160 (which is shared in a row or column of transistors) and an overlying semiconductor channel pillar 360 which has a smaller lateral width than the semiconductor channel rail 160. In the second embodiment, the two portions (160, 360) of each channel are vertically separated by and electrically connected by the optional middle active region 366. The combination of the first gate electrodes 152 and the second gate electrodes 452 provides a two-tier select gate configuration, in which each semiconductor channel pillar 360 is activated by second gate electrodes 452 located adjacent to the semiconductor channel pillar 360, while the underlying semiconductor channel rail 160 is activated by a combination of a pair of first gate electrodes 152 located adjacent to the semiconductor channel rail 160. Thus, the first gate electrodes 152 select a row or column of transistors, while the second gate electrodes 452 select the specific transistors in the row or column of transistors. The devices of the present disclosure employ a continuous conductive plate 102 (e.g., global bit line) as a bottom electrode for an array of field effect transistors. The continuous conductive plate 102 can include a low resistivity material such as a metallic material (e.g., tungsten), and can act as a global bit line to provide a low resistance conductive path for accessing the active region rails 106. The low resistivity of the continuous conductive plate 102 can increase the on-current of each of the vertical field effect transistors by reducing the resistivity of electrical wiring to the active region rails 106. Alternatively, the thickness of the continuous conductive plate 102 can be reduced compared to the thicknesses of global bit lines that are employed in conventional electrical wiring schemes. Thus, the devices of the present disclosure can provide a superior device structure providing higher device current and/or reduced height for electrical wiring structures underlying bottom active regions, i.e., the active region rails 106.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a two-dimensional array of vertical field effect transistors, wherein the two-dimensional array of vertical field effect transistors comprises:
    a first-tier structure comprising a laterally alternating sequence of semiconductor rail structures and first dielectric isolation rails that alternates along a first horizontal direction, wherein a first gate dielectric and a first gate electrode that laterally extend along a second horizontal direction are disposed between each neighboring pair of a semiconductor rail structure and a first dielectric isolation rail; and
    a second-tier structure comprising a laterally alternating sequence of composite rail structures and second dielectric isolation rails that alternates along the second horizontal direction, wherein each of the composite rail structures comprises a laterally alternating plurality of semiconductor pillar structures and dielectric pillar structures, and a second gate dielectric and a second gate electrode that laterally extend along the first horizontal direction are disposed between each neighboring pair of a composite rail structure and a second dielectric isolation rail.

2. The semiconductor structure of claim 1, wherein each of the semiconductor rail structures comprises:
    an active region rail comprising a doped semiconductor material having a doping of a first conductivity type; and a semiconductor channel rail comprising an intrinsic semiconductor material or a doped semiconductor material having a doping of a second conductivity type that is different from the first conductivity type at a dopant concentration that is less than a dopant concentration in the active region rail.

3. The semiconductor structure of claim 2, wherein each of the semiconductor pillar structures comprises:
a semiconductor channel pillar comprising an intrinsic semiconductor material or a doped semiconductor material having a doping of the second conductivity type; and
an active region portion having a doping of the first conductivity type at a dopant concentration that is greater than a dopant concentration in the semiconductor channel pillar.

4. The semiconductor structure of claim 3, wherein a channel of each of the vertical field effect transistors comprises a portion of the semiconductor channel rail which is shared with other vertical field effect transistors located in a same row or column of the two-dimensional array, and the semiconductor channel pillar which has a smaller lateral width than the semiconductor channel rail.

5. The semiconductor structure of claim 4, wherein:
the second gate electrode is located entirely above the first gate electrode such that the first gate electrode and the second gate electrode do not overlap in the vertical direction; and
no charge storage region is located between the channel of each of the field effect transistors and the first or the second gate electrode.

6. The semiconductor structure of claim 3, wherein each of the semiconductor pillar structures comprises a middle active region underlying the semiconductor channel pillar and having a doping of the first conductivity type.

7. The semiconductor structure of claim 2, further comprising a continuous conductive plate which is located over a substrate and which is electrically shorted to each of the active region rails.

8. The semiconductor structure of claim 7, further comprising a one-dimensional array of metal nitride rails located between the active region rails and the continuous conductive plate, wherein sidewalls of the metal nitride rails are vertically coincident with sidewalls of the semiconductor rail structures.

9. The semiconductor structure of claim 7, wherein:
each of the first gate dielectrics includes a pair of vertically extending first gate dielectric portions that extend from a top surface of the continuous conductive plate to bottom surfaces of the second gate dielectrics, and a horizontal first gate dielectric portion adjoined to the pair of vertically extending first gate dielectric portions and contacting the top surface of the continuous conductive plate; and
each of the second gate dielectrics includes a pair of vertically extending second gate dielectric portions that extend from top surfaces of the semiconductor rail structures to a height above a horizontal plane including top surfaces of the semiconductor pillar structures, and a horizontal second gate dielectric portion adjoined to the pair of vertically extending second gate dielectric portions and contacting the top surfaces of the semiconductor rail structures.

10. The semiconductor structure of claim 1, wherein each of the first dielectric isolation rails contacts bottom surfaces of a respective row of dielectric pillar structures that are arranged along the second horizontal direction.

11. The semiconductor structure of claim 1, wherein:
each of the first gate electrodes has a first uniform with and contacts bottom surfaces of a respective subset of the dielectric pillar structures;
each of the second gate electrodes has a second uniform width and is vertically spaced from the first-tier structure by a horizontal portion of a respective second gate dielectric; and
each of the second dielectric isolation rails comprises an upper second dielectric isolation rail portion having a first rail width, and a lower second dielectric isolation rail portion having a second rail width that is less than the first rail width by twice the second uniform width of the second gate electrodes.

12. The semiconductor structure of claim 1, further comprising a resistive random access memory (ReRAM) device located over the two dimensional array of vertical field effect transistors.

13. The semiconductor structure of claim 12, wherein the ReRAM device comprises:
a plurality of alternating stacks of insulating strips and electrically conductive word line strips overlying the two-dimensional array of vertical field effect transistors;
vertical local bit lines electrically shorted to a top end of a respective one of the semiconductor pillar structures and vertically extending between a respective neighboring pair of alternating stacks among the plurality of alternating stacks; and
resistive memory elements located at each intersection between the vertical local bit lines and the plurality of alternating stacks.

14. A method of forming a semiconductor structure, comprising:
forming a one-dimensional array of semiconductor rail structures spaced among one another along a first horizontal direction over a substrate, wherein each of the semiconductor rail structures laterally extends along a second horizontal direction;
forming first gate dielectrics and first gate electrodes on sidewalls of the semiconductor rail structures;
forming first dielectric isolation rails on the first gate electrodes and between neighboring pairs of semiconductor rail structures;
forming composite rail structures over the semiconductor rail structures, wherein each of the composite rail structures comprises a laterally alternating plurality of semiconductor pillar structures and dielectric pillar structures;
forming second gate dielectrics and second gate electrodes on sidewalls of the composite rail structures; and
forming second dielectric isolation rails on the second gate electrodes and between neighboring pairs of composite rail structures.

15. The method of claim 14, wherein the one-dimensional array of semiconductor rail structures is formed by:
forming a first stack including, from bottom to top, a first doped semiconductor material layer having a doping of a first conductivity type and a lower semiconductor channel material layer having a doping of a second conductivity type;
patterning the first stack into the one-dimensional array of semiconductor rail structures,
wherein each of the semiconductor rail structures comprises:
an active region rail that is a remaining portion of the first doped semiconductor material layer; and a semiconductor channel rail that is a remaining portion of the lower semiconductor channel material layer.

16. The method of claim 15, wherein the composite rail structures are formed by:
forming a laterally alternating sequence of semiconductor material rails and dielectric material rails that alternate along the first horizontal direction over the one-dimensional array of the semiconductor rail structures and the first dielectric isolation rails; and
forming line trenches that laterally extend along the first horizontal direction through the laterally alternating sequence of semiconductor material rails and dielectric material rails,
wherein each divided portion of the semiconductor material rails constitutes a semiconductor pillar structure, and each divided portion of the dielectric material rails constitutes a dielectric pillar structure.

17. The method of claim 16, wherein each of the semiconductor pillar structures comprises:
a semiconductor channel pillar comprising a doped semiconductor material having a doping of the second conductivity type; and
an active region portion having a doping of the first conductivity type at a dopant concentration that is greater than a dopant concentration in the semiconductor channel pillar.

18. The method of claim 15, further comprising forming a continuous conductive plate located over the substrate, wherein each of the active region rails is electrically shorted to the continuous conductive plate.

19. The method of claim 18, wherein the first gate dielectrics and the first gate electrodes are formed by:
forming a first gate dielectric layer on the sidewalls of the one-dimensional array of semiconductor rail structures and on a top surface of the continuous conductive plate;
forming a first gate electrode material layer on the first gate dielectric layer;
anisotropic ally etching horizontal portions of the first gate electrode material layer; and
removing portions of the first gate dielectric layer from above a horizontal plane including top surfaces of the first dielectric isolation rails, wherein:
remaining portions of the first gate dielectric layer constitute the first gate dielectrics; and
remaining portions of the first gate electrode material layer constitute the first gate electrodes.

20. The method of claim 19, wherein the second gate dielectrics and the second gate electrodes are formed by:
forming a second gate dielectric layer on the sidewalls of the composite rail structures and on top surfaces of the semiconductor rail structures and the first dielectric isolation rails;
forming a second gate electrode material layer on the second gate dielectric layer;
anisotropically etching horizontal portions of the second gate electrode material layer; and
removing portions of the second gate dielectric layer from above a horizontal plane including top surfaces of the second dielectric isolation rails, wherein:
remaining portions of the second gate dielectric layer constitute the second gate dielectrics; and
remaining portions of the second gate electrode material layer constitute the second gate electrodes.

21. The method of claim 14, wherein:
the one-dimensional array of semiconductor rail structures, the semiconductor pillar structures, the first and second gate dielectrics, and the first and second gate electrodes collectively constitute a two-dimensional array of vertical field effect transistors; and
the method further comprises forming a resistive random access memory (ReRAM) device over the two dimensional array of vertical field effect transistors, wherein the ReRAM device comprises:
a plurality of alternating stacks of insulating strips and electrically conductive word line strips overlying the two-dimensional array of vertical field effect transistors;
vertical local bit lines electrically shorted to a top end of a respective one of the semiconductor pillar structures and vertically extending between a respective neighboring pair of alternating stacks among the plurality of alternating stacks; and
resistive memory elements located at each intersection between the vertical local bit lines and the plurality of alternating stacks.

22. The method of claim 14, wherein the one-dimensional array of semiconductor rail structures and the composite rail structures are formed by:
forming a layer stack including, from bottom to top, a first doped semiconductor material layer having a doping of a first conductivity type, a lower semiconductor channel material layer having a doping of a second conductivity type, an upper semiconductor channel material layer, and a second doped semiconductor material layer having a doping of the first conductivity type;
patterning the layer stack into the one-dimensional array of semiconductor rail structures separated by line trenches; and
forming dielectric material rails in the line trenches.

* * * * *